(12) United States Patent
Shutoh et al.

(10) Patent No.: US 6,759,586 B2
(45) Date of Patent: Jul. 6, 2004

(54) THERMOELECTRIC MODULE AND HEAT EXCHANGER

(75) Inventors: Naoki Shutoh, Yokohama (JP);
Hiromitsu Takeda, Tokyo (JP);
Naruhito Kondo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 10/105,341

(22) Filed: Mar. 26, 2002

(65) Prior Publication Data

US 2002/0179135 A1 Dec. 5, 2002

(30) Foreign Application Priority Data

Mar. 26, 2001 (JP) .......................................... 2001-087036
Mar. 26, 2001 (JP) .......................................... 2001-087037

(51) Int. Cl.$^7$ .......................... H01L 35/28; H01L 35/30; H01L 35/08; H01L 35/20
(52) U.S. Cl. .......................... 136/205; 136/203; 136/210; 136/211; 136/212; 136/237; 136/240; 136/241; 252/62.3 T
(58) Field of Search .............................. 136/203, 205, 136/210, 211, 212, 237, 240, 241; 252/62.3 T (56) References Cited

U.S. PATENT DOCUMENTS

| 6,069,312 A | 5/2000 | Fleurial et al. ........... 136/236.1 |
| 6,563,039 B2 | 5/2003 | Caillat et al. ................ 136/205 |
| 6,673,996 B2 | 1/2004 | Caillat et al. ................ 136/201 |

OTHER PUBLICATIONS

B. C. Sales, et al., Physical Review B, vol. 56, No. 23, pp. 15 081–15 089, "Filled Skutterudite Antimonides: Electron Crystals and Phonon Glasses", Dec. 15, 1997.

*Primary Examiner*—Patrick Ryan
*Assistant Examiner*—Thomas H. Parsons
(74) *Attorney, Agent, or Firm*—Oblon, Spivak, McClelland, Maier & Neustadt, P.C.

(57) ABSTRACT

Disclosed is a thermoelectric module, comprising a plurality of p-type thermoelectric elements each comprising a p-type semiconductor having a skutterdite crystal structure, a plurality of n-type thermoelectric elements each comprising a n-type semiconductor having a skutterdite crystal structure, at least one first electrode, at least one second electrode, at least one first alloy layer and at least one second alloy layer, wherein said at least one first alloy layer and said at least one second alloy layer contain Sb and at least one transition metal element selected from the group consisting of Ag, Au and Cu.

16 Claims, 3 Drawing Sheets

THERMOELECTRIC MODULE AND HEAT EXCHANGER

CROSS-REFERENCE TO RELATED APPLICATIONS

This application is based upon and claims the benefit of priority from the prior Japanese Patent Applications No. 2001-087036, filed Mar. 26, 2001; and No. 2001-087037, filed Mar. 26, 2001, the entire contents of both of which are incorporated herein by reference.

BACKGROUND OF THE INVENTION

1. Field of the Invention

The present invention relates to a thermoelectric module and a heat exchanger equipped with the thermoelectric module.

2. Description of the Related Art

Depletion of resources is expected in the twenty-first century so as to make it very important nowadays to develop measures for effectively utilizing energy, and various systems are being proposed along this line. Particularly, the thermoelectric element is expected to provide a means for recovering the energy discarded uselessly in the past as waste heat. The thermoelectric element has already been put practical use as a module comprising a p-type semiconductor element and an n-type semiconductor element, which are connected in series.

Extensive researches are being conducted on many thermoelectric semiconductor materials in an attempt to achieve a high thermoelectric efficiency. Particularly, strenuous efforts are being made in an attempt to improve the power generation efficiency.

However, the thermoelectric material that has been put into practical use is the Bi (bismuth)-Te (tellurium) system including a Bi—Te alloy containing a third element such as antimony (Sb) or selenium (Se). The other materials, which have certainly been used in special fields, have not yet been produced on a commercial basis.

The waste-heat boiler is designed to obtain only steam or warm water through a heat exchanger, and the power required for operating the boiler is introduced from the outside. In recent years, it has been attempted to incorporate a thermoelectric module in the waste-heat boiler so as to produce electric power from the waste heat. In this case, it is desirable for the thermoelectric element to be operated under temperatures as high as possible because the thermoelectric element is capable of utilizing a heat source having a higher temperature. Particularly, it is desirable for the thermoelectric element to be operated under temperatures not lower than 300° C.

However, the Bi—Te series thermoelectric element is operable under temperatures of at most 200° C., failing to satisfy the requirement pointed out above.

BRIEF SUMMARY OF THE INVENTION

An object of the present invention is to provide a thermoelectric module with improved thermoelectric performance under temperatures not lower than about 300° C., and to provide a heat exchanger using the particular thermoelectric module.

A first thermoelectric module of the present invention comprises:

a plurality of p-type thermoelectric elements each comprising a p-type semiconductor having a skutterdite crystal structure, each of the p-type thermoelectric elements having a first surface having a high temperature and a second surface having a temperature lower than that of the first surface;

a plurality of n-type thermoelectric elements each comprising a n-type semiconductor having a skutterdite crystal structure, each of the n-type thermoelectric elements having a first surface having a high temperature and a second surface having a temperature lower than that of the first surface, and the p-type thermoelectric elements and the n-type thermoelectric elements being arranged alternately;

at least one first electrode and at least one second electrode connecting the p-type thermoelectric elements and the n-type thermoelectric elements in series;

at least one first alloy layer for bonding the at least one first electrode to the first surface of the one p-type thermoelectric element and to the first surface of the one n-type thermoelectric element adjacent to the one p-type thermoelectric element; and at least one second alloy layer for bonding the at least one second electrode to the second surface of the one p-type thermoelectric element and to the second surface of the one n-type thermoelectric element adjacent to the one p-type thermoelectric element, wherein the at least one first alloy layer and the at least one second alloy layer contain Sb and at least one transition metal element selected from the group consisting of Ag, Au and Cu.

A second thermoelectric module of the present invention comprises:

a plurality of p-type thermoelectric elements each comprising a p-type semiconductor having a skutterdite crystal structure, each of the p-type thermoelectric elements having a first surface having a high temperature and a second surface having a temperature lower than that of the first surface;

a plurality of n-type thermoelectric elements each comprising a n-type semiconductor having a skutterdite crystal structure, each of the n-type thermoelectric elements having a first surface having a high temperature and a second surface having a temperature lower than that of the first surface, and the p-type thermoelectric elements and the n-type thermoelectric elements being arranged alternately;

at least one first electrode and at least one second electrode connecting the p-type thermoelectric elements and the n-type thermoelectric elements in series, and the at least one first electrode and the at least one second electrode containing Fe and having a thermal expansion coefficient falling within a range of between $8 \times 10^{-6}/°$ C. and $16 \times 10^{-6}/°$ C.;

at least one first alloy layer for bonding the at least one first electrode to the first surface of the one p-type thermoelectric element and to the first surface of the one n-type thermoelectric element adjacent to the one p-type thermoelectric element; and at least one second alloy layer for bonding the at least one second electrode to the second surface of the one p-type thermoelectric element and to the second surface of the one n-type thermoelectric element adjacent to the one p-type thermoelectric element, wherein the at least one first alloy layer and the at least one second alloy layer contain Sb and at least one transition metal element selected from the group consisting of Ag, Au and Cu.

A third thermoelectric module of the present invention comprises:
- a plurality of p-type thermoelectric elements each comprising a p-type semiconductor having a skutterdite crystal structure, each of the p-type thermoelectric elements having a first surface having a high temperature and a second surface having a temperature lower than that of the first surface;
- a plurality of n-type thermoelectric elements each comprising a n-type semiconductor having a skutterdite crystal structure, each of the n-type thermoelectric elements having a first surface having a high temperature and a second surface having a temperature lower than that of the first surface, and the p-type thermoelectric elements and the n-type thermoelectric elements being arranged alternately;
- at least one first electrode and at least one second electrode connecting the p-type thermoelectric elements and the n-type thermoelectric elements in series, and the at least one first electrode and the at least one second electrode containing silver as a main component;
- at least one first silver-antimony alloy layer for bonding the at least one first electrode to the first surface of the one p-type thermoelectric element and to the first surface of the one n-type thermoelectric element adjacent to the one p-type thermoelectric element; and
- at least one second silver-antimony alloy layer for bonding the at least one second electrode to the second surface of the one p-type thermoelectric element and to the second surface of the one n-type thermoelectric element adjacent to the one p-type thermoelectric element.

A first heat exchanger of the present invention comprises at least one thermoelectric module selected from the first to third thermoelectric modules of the present invention defined as above.

Further, a second heat exchanger of the present invention performs a heat exchange between a high temperature fluid and a low temperature fluid and comprises a thermoelectric module arranged between the fluid passageway of the high temperature fluid and the fluid passageway of the low temperature fluid, the thermoelectric module comprising:
- a plurality of p-type thermoelectric elements each comprising a p-type semiconductor having a skutterdite crystal structure, each of the p-type thermoelectric elements having a first surface and a second surface;
- a plurality of n-type thermoelectric elements each comprising a n-type semiconductor having a skutterdite crystal structure, each of the n-type thermoelectric elements having a first surface and a second surface, and the p-type thermoelectric elements and the n-type thermoelectric elements being arranged alternately;
- at least one first electrode and at least one second electrode connecting the p-type thermoelectric elements and the n-type thermoelectric elements in series, the at least one first electrode heated by the fluid passageway of the high temperature fluid, and the at least one second electrode cooled by the fluid passageway of the low temperature fluid;
- at least one first alloy layer for bonding the at least one first electrode to the first surface of the one p-type thermoelectric element and to the first surface of the one n-type thermoelectric element adjacent to the one p-type thermoelectric element; and
- at least one second alloy layer for bonding the at least one second electrode to the second surface of the one p-type thermoelectric element and to the second surface of the one n-type thermoelectric element adjacent to the one p-type thermoelectric element, wherein the at least one first alloy layer and the at least one second alloy layer contain Sb and at least one transition metal element selected from the group consisting of Ag, Au and Cu.

DETAILED DESCRIPTION OF THE INVENTION

An example of the thermoelectric module of the present invention will now be described.

Specifically, the thermoelectric module of the present invention comprises a plurality of p-type thermoelectric elements each comprising a p-type semiconductor having a skutterdite crystal structure, and a plurality of n-type thermoelectric elements each comprising a n-type semiconductor having a skutterdite crystal structure. Each of the p-type thermoelectric elements and the n-type thermoelectric elements has a first surface having a high temperature and a second surface having a temperature lower than that of said first surface. The p-type thermoelectric elements and The n-type thermoelectric elements were arranged alternately.

The thermoelectric module of the present invention further comprises at least one first electrode and at least one second electrode connecting said p-type thermoelectric elements and said n-type thermoelectric elements in series;
- at least one first alloy layer for bonding said at least one first electrode to said first surface of said one p-type thermoelectric element and to said first surface of said one n-type thermoelectric element adjacent to said one p-type thermoelectric element; and
- at least one second alloy layer for bonding said at least one second electrode to said second surface of said one p-type thermoelectric element and to said second surface of said one n-type thermoelectric element adjacent to said one p-type thermoelectric element, wherein said at least one first alloy layer and said at least one second alloy layer contain Sb and at least one transition metal element selected from the group consisting of Ag, Au and Cu.

The p-type thermoelectric element, the n-type thermoelectric element, the first electrode, the second electrode, the first alloy layer and the second alloy layer included in the thermoelectric module of the present invention will now be described.

1) P-Type Thermoelectric Element

The p-type thermoelectric element used in the present invention includes a p-type semiconductor having a skutterudite structure. The semiconductors having the particular structure include, for example, a Co—Sb series semiconductor such as $CoSb_3$ as well as $RhSb_3$, $IrSb_3$ and $CoAs_3$. Particularly, it is desirable to use the Co—Sb series semiconductor. It is possible for Co of the Co—Sb series semiconductor to be partly substituted by a p-type impurity such as Fe, Ru or Os. Incidentally, it is less desirable to use $CoAs_3$ in view of its effect on the environment.

Particularly, it is desirable to use a p-type semiconductor having a filled skutterudite structure in which at least one heavy element selected from the group consisting of La, Ce, Pr, Nd, Sm, Eu, Gd, Tb, Dy, Ho, Er, Tm, Yb, Lu, Th and U is loaded in the pore of the crystal structure of the $ASb_3$-based compound, where A represents at least one element selected from the group consisting of Co, Rh and Ir. In the particular compound, the lattice vibration is scattered by the loaded heavy element so as to lower the heat conductivity and, thus, to further improve the thermoelectric characteristics.

2) N-Type Thermoelectric Element

The n-type thermoelectric element used in the present invention includes a n-type semiconductor having a skutterudite structure. The semiconductors having the particular structure include, for example, a Co—Sb series semiconductor such as $CoSb_3$ as well as $RhSb_3$, $IrSb_3$ and $CoAs_3$. Particularly, it is desirable to use the Co—Sb series semiconductor. It is possible for Co of the Co—Sb series semiconductor to be partly substituted by an n-type impurity such as Pd, Pt or Ni. Incidentally, it is less desirable to use $CoAs_3$ because this semiconductor compound is toxic.

Particularly, it is desirable to use a compound having a filled skutterudite structure in which at least one heavy element selected from the group consisting of La, Ce, Pr, Nd, Sm, Eu, Gd, Tb, Dy, Ho, Er, Tm, Yb, Lu, Th and U is loaded in the pore of the crystal structure of the $ASb_3$-based compound, where A represents at least one element selected from the group consisting of Co, Rh and Ir. In the particular compound, the lattice vibration is scattered by the loaded heavy element so as to lower the heat conductivity and, thus, to further improve the thermoelectric characteristics.

3) Alloy Layer

Alloy layer includes at least one first alloy layer and at least one second alloy layer.

The alloy layer contains an alloy containing at least one kind of a transition metal element selected from the group consisting of Ag, Au and Cu, and another element of Sb.

It is desirable for the alloy layer to have a composition rich in antimony on the side of the p-type or n-type thermoelectric element and a composition rich in the transition metal element on the side of the electrode. Particularly, it is desirable for the alloy layer to have construction (a) or construction (b) given below:

(a) It is desirable for the rate of presence of the transition metal element at the interface between the alloy layer and the electrode to be higher than the rate of present of the transition metal element at the interface between the alloy layer and the p-type or n-type thermoelectric element.

(b) It is desirable for the rate of presence of Sb at the interface between the alloy layer and the p-type or n-type thermoelectric element to be higher than the rate of present of Sb at the interface between the alloy layer and the electrode.

The construction (a) or (b) given above permits the p-type and n-type thermoelectric elements to be bonded to the electrode by the alloy layer more strongly.

The alloy layer satisfying construction (a) or (b) can be formed by method (I) or (II) given below:

(I) The alloy layer can be obtained by forming a paste-like mixed brazing filler metal layer containing an Sb power and a powder of at least one transition metal selected from the group consisting of Ag, Au and Cu between the p-type thermoelectric element and the electrode and between the n-type thermoelectric element and the electrode, followed by applying a heat treatment to the mixed brazing filler metal layer. Incidentally, it is desirable for the temperature of the heat treatment to fall within a range between the melting point of the brazing filler metal and the heat-resistant temperature of the semiconductor, more preferably between the melting point of the brazing filler metal and 700° C.

(II) A bonding layer is formed first on the surface of the electrode. Then, a paste-like mixed brazing filler material layer containing a powder of at least one kind of a transition metal selected from the group consisting of Ag, Au and Cu and an Sb powder is formed between the bonding layer and the n-type thermoelectric element and between the bonding layer and the p-type thermoelectric element. Further, a heat treatment is applied so as to melt the mixed brazing filler material layer, with the result that a mutual diffusion takes place between the molten brazing filler material layer and the bonding layer and between the molten brazing filler material layer and the thermoelectric element. It follows that the alloy layer can be formed between the p-type thermoelectric element and the electrode and between the n-type thermoelectric element and the electrode.

It is desirable for the bonding layer to consist essentially of at least one transition metal selected from the group consisting of Ag, Au and Cu. It is also desirable for at least one transition metal element contained in the bonding layer to be equal to the transition metal element contained in the alloy layer. If the transition metal element contained in the bonding layer differs from the transition metal element contained in the alloy layer, it is difficult to carry out the liquid phase diffusion welding using a mixed brazing filler metal.

The bonding layer can be formed by, for example, a vapor deposition, a sputtering method, or an electroplating method. Particularly, it is desirable to employ the electroplating method because the bonding layer can be formed easily.

Silver has a melting point of about 960° C., and antimony has a melting point of about 630. Where silver and antimony are mixed with each other, the melting point of the mixture is lowered. Where the mixture contains about 41 mol % of antimony, the mixture has a melting point of about 485° C. In the mixed brazing filler metal containing an Sb powder and a powder of at least one transition metal selected from the group consisting of Ag, Au and Cu, it is desirable for the molar ratio of Sb to fall within a range of between 24 mol % and 90 mol %. If the molar ratio of Sb is lower than 24 mol %, it is possible for the melting point of the brazing filler metal to be rendered higher than 700° C. If the melting point of the brazing filler metal exceeds 700° C., it is necessary to elevate the temperature for the heat treatment, with the result that the thermoelectric element tends to be thermally degraded by the heat treatment. The melting point of the brazing filler metal is lowered with increase in the molar ratio of Sb. However, if the Sb powder alone is used as the brazing filler metal, the bonding strength between the electrode and the thermoelectric element is markedly lowered. It follows that, in order to improve the bonding strength between the electrode and the thermoelectric element, it is desirable for the molar ratio of Sb to fall within a range of between 24 mol % and 90 mol %.

It is desirable for the thickness of the alloy layer to fall within a range of between 1 $\mu$m and 1 mm. If the alloy layer has a thickness less than 1 $\mu$m, it is possible for the bonding strength between the electrode and the thermoelectric element to be lowered. On the other hand, if the thickness of the alloy layer exceeds 1 mm, it is possible for the heat conductivity and the electron conductivity of the alloy layer to be lowered so as to make it difficult for the thermoelectric module to produce a large thermoelectromotive force.

In the case of using a compound having a filled skutterudite structure as at least one of the n-type semiconductor and the p-type semiconductor, it is desirable for the alloy layer to contain at least one heavy element selected from the group consisting of La, Ce, Pr, Nd, Sm, Eu, Gd, Tb, Dy, Ho, Er, Tm, Yb, Lu, Th and U. In this case, it is possible to improve the bonding strength between the thermoelectric element and the electrode. Also, in order to further improve the bonding strength between the thermoelectric element and the electrode, it is desirable for the heavy element to be contained in the alloy layer in an amount of at least 0.1 mol %.

If a mixed brazing filler metal layer containing a powder of a transition metal such as Ag and an Sb powder is formed between the thermoelectric element containing an ASb series compound having a filled skutterudite structure and the electrode, followed by applying a heat treatment to the mixed brazing filler metal layer, the mixed brazing filler metal layer is melted. In this case, a mutual diffusion is brought about among the transition metal element contained in the electrode, Sb contained in the thermoelectric element and the mixed brazing filler metal, with the result that the electrode is bonded to the thermoelectric element with the alloy layer interposed therebetween. If a heavy element such as Ce, which is contained in the thermoelectric element, is diffused into the mixed brazing filler metal layer, the bonding strength can be further improved.

4) Electrode

Electrode includes at least one first electrode and at least one second electrode.

It is possible to use electrodes A and B described below in the present invention.

(A) Electrode A consists essentially of an alloy containing Ag, Ag metal, a sintered body of an alloy containing Ag, or a sintered body of Ag metal. The Ag metal used herein includes a pure Ag and Ag partly converted into a silver oxide, e.g., $Ag_2O$.

It is desirable for the Ag content of the electrode to be at least 50% by weight. If the Ag content of the electrode is lower than 50% by weight, it is possible for the electron conductivity of the electrode to be lowered. In addition, it is possible for the bonding strength between the electrode and the thermoelectric element to be lowered.

The components of the electrode other than Ag include, for example, Au and Pt.

It is possible to use a plate of an alloy containing Ag or a plate of Ag metal for forming electrode A. It is also possible to prepare electrode A by, for example, sintering an alloy containing Ag or Ag metal or by forming a silver alloy layer or a silver layer by vapor deposition or flame spraying. Particularly, it is desirable to use a plate of an alloy containing Ag or a plate of Ag metal as the electrode.

In electrode A containing Ag, Ag tends to be oxidized so as to form an oxide having a high resistivity. However, if electrode A is put in an environment having a high temperature not lower than 300° C., the reaction for the silver oxide to be converted back into silver takes place. It follows that it is possible for electrode A containing Ag to exhibit a high electron conductivity under an environment of a high temperature not lower than 300° C.

If a mixed brazing filler metal layer containing Ag and Sb is formed between the n-type thermoelectric element containing a Co—Sb series compound and electrode A and between the p-type thermoelectric element containing Co—Sb series compound and electrode A, followed by melting the mixed brazing filler metal layer by the heating under pressure, a mutual diffusion of the Ag component takes place between electrode A and the brazing filler metal layer, and a mutual diffusion of the Sb component takes place between the thermoelectric element and the brazing filler metal layer. As a result, a AgSb alloy layer in which the composition is continuously changed from the Ag-based alloy into the Sb-based alloy is formed between the electrode and the thermoelectric element so as to improve the bonding strength between the n-type thermoelectric element and electrode A and the bonding strength between the p-type thermoelectric element and electrode A. It follows that it is possible to decrease the electrical contact resistance between the thermoelectric element and the electrode so as to decrease the internal resistance of the thermoelectric module. Also, since it is possible to improve the heat conductivity in the alloy layer, it is possible to decrease the heat resistance so as to permit the thermoelectric module to produce a larger thermoelectromotive force.

(B) Electrode B includes an Fe-containing substrate and having a thermal expansion coefficient falling within a range of between $8 \times 10^{-6}$/° C. and $16 \times 10^{-6}$/° C.

The Fe-containing substrate includes, for example, an Fe-containing metal plate and an Fe-containing alloy plate.

Where the electrode has a thermal expansion coefficient falling within the range noted above, it is possible to decrease the difference in the thermal expansion coefficient between the n-type thermoelectric element and the electrode and between the p-type thermoelectric element and the electrode. As a result, it is possible to suppress the generation of the thermal stress when the high temperature side of the thermoelectric module is set at a temperature not lower than 300° C. so as to make it possible to avoid the occurrence of the breakage such as cracks in the semiconductor or the alloy layer when the thermoelectric module is used repeatedly under the high temperature conditions. It follows that it is possible to improve the durability of the thermoelectric module under high temperatures not lower than 300° C.

It is desirable to use a martensite series stainless steel presented by JIS SUS410 as the Fe-containing substrate. It is also possible to use, for example, a carbon steel or an alloy steel as far as the steel has a thermal expansion coefficient falling within a range of between $8 \times 10^{-6}$/° C. and $16 \times 10^{-6}$/° C. Incidentally, JIS SUS410 has a thermal expansion coefficient of $10.3 \times 10^{-6}$/° C.

An example of a thermoelectric module comprising electrode A will now be described.

Specifically, a first thermoelectric module of the present invention comprises:
- a plurality of p-type thermoelectric elements each comprising p-type semiconductor having a skutterudite crystal structure;
- a plurality of n-type thermoelectric elements each comprising n-type semiconductor having a skutterudite crystal structure;
- a plurality of electrodes formed on a first surface on the high temperature side of the p-type thermoelectric element and the n-type thermoelectric element and on a second surface on the low temperature side of the p-type thermoelectric element and the n-type thermoelectric element, the electrode allowing the p-type thermoelectric element and the n-type thermoelectric element to be connected to each other in series, and the electrode containing silver as a main component; and
- a plurality of silver-antimony alloy layers formed between the p-type thermoelectric element and the electrode and between the n-type thermoelectric element and the electrode.

The thermoelectric element that can be used under temperatures not lower than 300° C. includes a semiconductor having a skutterudite crystal structure. However, since the bonding strength between the thermoelectric element and the electrode was insufficient under high temperatures not lower than 300° C., it was difficult to obtain a high thermoelectric performance under high temperatures not lower than 300° C.

Under the circumstances, the present inventors have conducted extensive research on the materials that can be used as the bonding means between the electrode and the thermoelectric element. As a result, it has been found that it is most desirable to use an electrode formed of silver or a material containing silver as a main component and to bond the electrode to the thermoelectric element including semiconductor having a skutterudite crystal structure by using a mixed brazing filler metal containing silver and antimony. Incidentally, the material containing silver as a main component represents a material containing at least 50% by weight of silver. Also, it is desirable for the electrode to contain, for example, gold or platinum as additional components other than silver.

Silver or the alloy containing silver as a main component substantially ceases to have an elastic deformation region under temperatures exceeding about 600° C. so as to produce the effects that the thermal stress is not generated and that, even if subjected to a heat treatment under the air atmosphere, the oxide is decomposed at about 160° C. It follows that silver or the alloy containing silver as a main component is adapted for use as an electrode under high temperatures. Further, silver or the silver-based alloy produces additional effects that (i) the thermoelectric characteristics of the thermoelectric element including semiconductor having a skutterudite crystal structure are not adversely affected, and that (ii) it is possible to output a large electric power because silver or the silver-based alloy has a high conductivity.

However, the bonding strength between the thermoelectric element including semiconductor having a skutterudite crystal structure and silver layer and the bonding strength between the thermoelectric element containing semiconductor noted above and the silver-based alloy layer are not reasonably high. Also, even if the thermoelectric element is bonded to the electrode by using a binder such as a lead-based solder, the bonding strength is lowered under high temperatures not lower than about 300° C.

In the present invention, a mixed brazing filler metal containing silver and antimony is used as a binder and, thus, a bonding layer (silver-antimony alloy layer) in which the composition is continuously changed from the silver-based composition into the antimony-based composition is automatically formed between the electrode and the thermoelectric element containing semiconductor having a skutterudite crystal structure so as to achieve a strong bonding and a good electrical connection between the electrode and the thermoelectric element. As a result, it is possible to decrease the electrical contact resistance between the electrode and the thermoelectric element containing semiconductor having a skutterudite crystal structure so as to decrease the internal resistance of the entire thermoelectric module. Also, since the heat conductivity in the bonding layer is improved, the heat resistance is decreased so as to make it possible to obtain a larger thermoelectromotive force. In order to improve the bonding strength between the electrode and the thermoelectric element containing semiconductor having a skutterudite crystal structure, it is desirable for the thickness of the bonding layer (silver-antimony alloy layer) to fall within a range of between about 1 $\mu$m and about 1 mm.

Silver has a melting point of about 960° C., and antimony has a melting point of about 630° C. Where silver and antimony are mixed with each other, the melting point of the mixture is lowered. Where the mixture contains about 41 mol % of antimony, the mixture has a melting point of about 485° C. In the mixed brazing filler metal containing silver and Sb, it is desirable for the molar ratio of Sb to fall within a range of between 24 mol % and 90 mol %.

An example of the first thermoelectric module of the present invention will now be described with reference to FIGS. 1 and 2.

Figure 1:
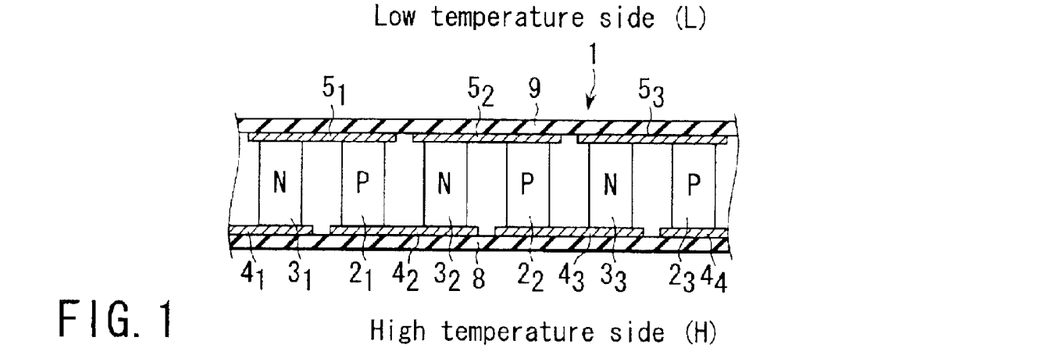
FIG. 1 is a cross-sectional view schematically showing the construction of a thermoelectric module according to one embodiment of the present invention.
Figure 2:
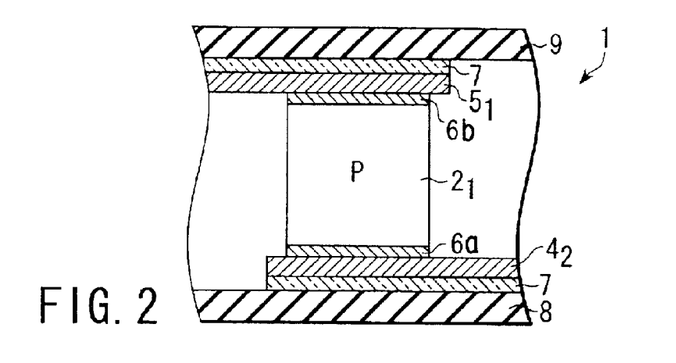
FIG. 2 is a cross-sectional view showing in a magnified fashion the peripheral portion of a p-type thermoelectric element shown in FIG. 1.

FIG. 1 is a cross-sectional view schematically showing the construction of the thermoelectric module 1 according to one embodiment of the present invention, and FIG. 2 is a cross sectional view showing in a magnified fashion the peripheral region of the p-type thermoelectric element shown in FIG. 1.

As shown in FIG. 1, the thermoelectric module 1 comprises a plurality of p-type thermoelectric elements $2_1$ to $2_3$ each comprising semiconductor having a skutterudite crystal structure and a plurality of n-type thermoelectric elements $3^1$ to $3_3$ each comprising semiconductor having a skutterudite crystal structure. The p-type thermoelectric element $2_1$ to $2_3$ and the n-type thermoelectric elements $3_1$ to $3_3$ are alternately arranged. First electrodes $4_1$ to $4_4$ and second electrodes $5_1$ to $5_3$ are arranged to permit the p-type thermoelectric elements $2_1$ to $2_3$ and the n-type thermoelectric elements $3_1$ to $3_3$ to be connected in series. To be more specific, the second electrode $5_1$ permits the n-type thermoelectric element $3_1$ on the left edge in the drawing to be connected in series to the p-type thermoelectric element $2_1$ positioned adjacent to the n-type thermoelectric element $3_1$. Also, the first electrode $4_2$ permits the p-type thermoelectric element $2_1$ to be connected in series to the n-type thermoelectric element $3_2$ positioned adjacent to the p-type thermoelectric element $2_1$. Then, the second electrode $5_2$ permits the n-type thermoelectric element $3_2$ to be connected in series to the p-type thermoelectric element $2_2$ positioned adjacent to the n-type thermoelectric element $3_2$. In this fashion, the n-type thermoelectric element is connected in series to the adjacent p-type thermoelectric element by the first electrode and, then, the p-type thermoelectric element is connected in series to another n-type thermoelectric element by the second electrode so as to permit the n-type thermoelectric elements and the p-type thermoelectric elements to be connected in series by the first and second electrodes.

FIG. 2 is a cross-sectional view showing in a magnified fashion the p-type thermoelectric element $2_1$ shown in FIG. 1. As shown in the drawing, a first alloy layer 6a is formed between the first surface of the p-type thermoelectric element $2_1$ and the first electrode $4_2$. A second alloy layer 6b is formed between the second surface of the p-type thermoelectric element $2_1$ and the second electrode $5_1$. The p-type thermoelectric element $2_1$ has a first surface and a second surface having a temperature lower than that of the first surface. The first alloy layer 6a and the second alloy layer 6b are formed by, for example, coating a paste containing a silver powder and an antimony powder, followed by applying a heat treatment to the coated paste. It should be noted that the first alloy layer 6a and the second alloy layer 6b are a silver-antimony alloy layer containing a high concentration of antimony on the side of the thermoelectric element and a high concentration of silver on the side of the electrode. In other words, each of the first alloy layer 6a and the second alloy layer 6b is a silver-antimony alloy layer in which the composition is continuously changed from the Sb-based composition into the Ag-based composition. The first alloy layer 6a and the second alloy layer 6b permit the first electrode, the p-type thermoelectric element and the second electrode to be strongly bonded to each other in an electrically satisfactory state. Alloy layers similar to those described above in conjunction with the p-type thermoelectric element are formed between the first electrodes $4_1$ to $4_4$ and the n-type thermoelectric elements $3_1$ to $3_3$ and between the second electrodes $5_1$ to $5_3$ and the n-type thermoelectric elements $3_1$ to $3_3$, respectively. In order to obtain a strong bonding strength between the thermoelectric elements and the electrodes, it is desirable for the thickness of the first alloy layer 6a and the second alloy layer 6b to fall within a range of between about 1 μm and about 1 mm.

A first insulating heat conductive plate 8 is arranged on the first electrodes $4_1$ to $4_4$ with a frit glass layer 7 interposed therebetween. Likewise, a second insulating heat conductive plate 9 is arranged on the second electrodes $5_1$ to $5_3$ with another frit glass layer 7 interposed therebetween.

It is possible to use a ceramic material for forming each of the first insulating heat conductive plate 8 and the second insulating heat conductive plate 9. Particularly, it is desirable to use aluminum nitride or alumina, which has high insulating properties and a high heat conductivity, for forming the first and second insulating heat conductive plates 8 and 9. Incidentally, the frit glass layer 7 is used for improving the bonding strength between the electrode and the insulating heat conductive plate.

It is desirable to use, for example, cobalt-antimony series semiconductor material such as $CoSb_3$ as well as $RhSb_3$ and $IrSb_3$ as a compound having a skutterudite crystal structure each of the p-type thermoelectric elements $2_1$ to $2_3$ and the n-type thermoelectric elements $3_1$ to $3_3$. $CoAs_3$ has a similar crystal structure. However, it is not desirable to use $CoAs_3$ because $CoAs_3$ is toxic. In the p-type thermoelectric elements $2_1$ to $2_3$, it is possible for Co to be partly substituted by a p-type impurity such as Fe, Ru or Os. On the other hand, in the n-type thermoelectric elements $3_1$ to $3_3$, it is possible for Co to be partly substituted by an n-type impurity such as Pd, Pt or Ni.

Further, in the p-type semiconductor and the n-type semiconductor, it is desirable for a heavy element such as La, Ce, Pr, Nd, Sm, Eu, Gd, Tb, Dy, Ho, Er, Tm, Yb, Lu, Th or U to be loaded in the pores of the skutterudite crystal structure so as to form a filled skutterudite structure. In this case, the lattice vibration can be scattered by the loaded heavy element so as to lower the heat conductivity and, thus, to improve the thermoelectric characteristics.

Concerning the material of the first electrodes $4_1$ to $4_4$ and the second electrodes $5_1$ to $5_3$, it is desirable to use silver or a silver-based material as a main component and to use, for example, gold or platinum as additional elements other than silver. These electrodes $4_1$ to $4_4$ and $5_1$ to $5_3$ can be formed by the sintering method or other methods such as a vapor deposition method or a flame spraying method. Particularly, it is desirable to use a silver plate or a silver alloy plate noted above for forming these electrodes.

If a temperature difference is imparted between the first and second insulating heat conductive plates 8 and 9 in the thermoelectric module 1 constructed as shown in FIGS. 1 and 2 such that the first insulating heat conductive plate 8 functions as a high temperature side (H) and the second insulating heat conductive plate 9 functions as a low temperature side (L), a potential difference is generated between the first electrodes $4_1$ to $4_4$ and the second electrodes $5_1$ to $5_3$. If a load is connected between the terminals of the electrodes, it is possible to obtain electric power.

An example of a second thermoelectric module comprising electrode B will now be described.

The second thermoelectric module comprises a first electrode member on the high temperature side, a second electrode member on the low temperature side, a Co—Sb series semiconductor, which acts as a thermoelectric element, arranged between the first electrode member and the second electrode member and electrically connected to both the first electrode member and the second electrode member.

Each of the first and second electrode members contains an iron-based material having a thermal expansion coefficient falling within a range of between $8 \times 10^{-6}/°$ C. and $16 \times 10^{-6}/°$ C. Also, an alloy layer containing Sb and at least one transition metal element selected from the group consisting of Ag, Au and Cu, is formed between the first electrode member and the thermoelectric element and between the second electrode member and the thermoelectric element.

The Co—Sb series thermoelectric element includes an n-type thermoelectric element and a p-type thermoelectric element. The n-type Co—Sb series thermoelectric elements and the p-type Co—Sb series thermoelectric elements are alternately arranged to form, for example, an n-p-n-p structure. Each of the n-type Co—Sb series thermoelectric element and the p-type Co—Sb series thermoelectric element has a first surface and a second surface. The first electrode member noted above is arranged on the first surface of each of the p-type thermoelectric element and the n-type thermoelectric element. On the other hand, the second electrode member is arranged on the second surface of each of the p-type thermoelectric element and the n-type thermoelectric element. Also, the n-type Co—Sb series thermoelectric elements and the p-type Co—Sb series thermoelectric elements are connected in series by the first electrode member and the second electrode member.

In order to improve the bonding strength, it is desirable for the surface of the electrode member to be covered with metal layer containing at least one metal selected from the group consisting of Ag, Au and Cu.

It is also desirable for an insulating heat conductive plate formed of a ceramic material to be arranged on that surface of the first electrode member or the second electrode member which is opposite to the surface on which the thermoelectric element is arranged. It is desirable for the insulating heat conductive plate to be formed of aluminum nitride, silicon nitride, silicon carbide or alumina in order to improve the energy conversion efficiency.

An example of the second thermoelectric module will now be described with reference to FIG. 3. Specifically, FIG.

3 is a cross-sectional view schematically showing the construction of the thermoelectric module 11 according to another embodiment of the present invention.

Figure 3:
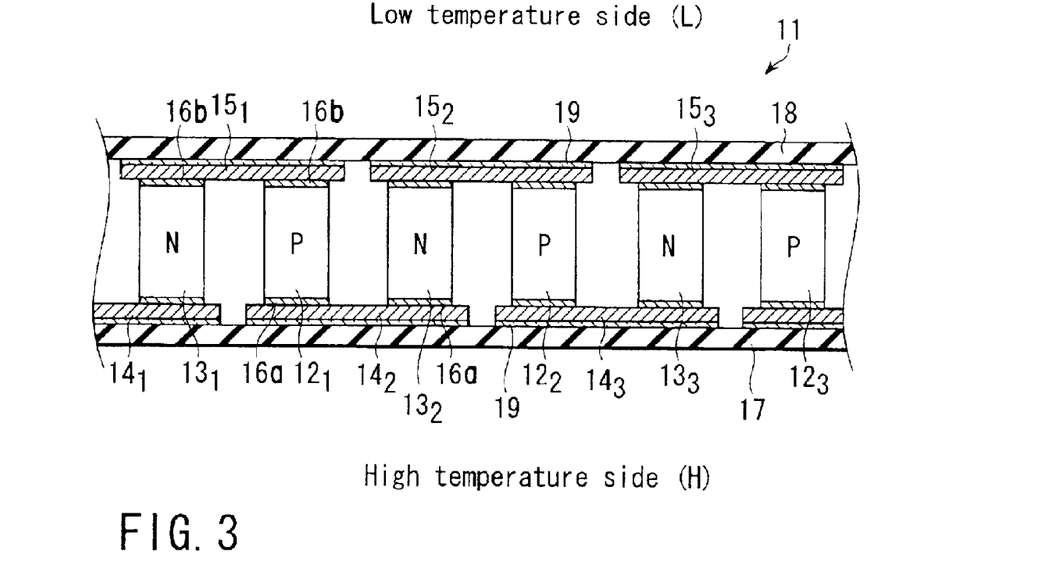
FIG. 3 is a cross-sectional view schematically showing the construction of a thermoelectric module according to another embodiment of the present invention.

As shown in FIG. 3, the thermoelectric module 11 comprises a plurality of p-type cobalt-antimony series thermoelectric elements $12_1$ to $12_3$ each containing a p-type cobalt-antimony series semiconductor material and a plurality of n-type cobalt-antimony series thermoelectric elements $13_1$ to $13_3$ each containing an n-type cobalt-antimony series semiconductor material. These p-type thermoelectric elements $12_1$ to $12_3$ and n-type thermoelectric elements $13_1$ to $13_3$ are alternately arranged to form an n-p-n-p-n-p arrangement.

The cobalt-antimony series semiconductor materials forming the p-type thermoelectric elements $12_1$ to $12_3$ and the n-type thermoelectric elements $13_1$ to $13_3$ include, for example, $CoSb_3$, $RhSb_3$ and $IrSb_3$ each having a skutterudite structure. $CoAs_3$ has a similar crystal structure. However, since arsenic tends to adversely affect the environment, it is not desirable to use $CoAs_3$. In the p-type semiconductor material, it is possible for Co to be partly replaced by a p-type impurity such as Fe, Ru or Os. On the other hand, in the n-type semiconductor material, it is possible for Co to be partly replace by an n-type impurity such as Pd, Pt or Ni. Further, for improving the characteristics, it is desirable for the thermoelectric element to be low in heat conductivity. Such being the situation, it is desirable for a heavy element to be loaded in the pores of the crystal of the compound having a skutterudite crystal structure. In this case, the lattice vibration is scattered by the loaded heavy element so as to lower the heat conductivity and, thus, to improve the thermoelectric characteristics.

A first electrode member $14_2$ is arranged on the first surface in the lower portions of the p-type thermoelectric element $12_1$ and the n-type thermoelectric element $13_2$ positioned adjacent to the p-type thermoelectric element $12_1$ for connecting these thermoelectric elements $12_1$ and $13_2$ in series. Also, a second electrode member $15_2$ is arranged on the second surface in the upper portions of the n-type thermoelectric element $13_2$ and the p-type thermoelectric element $12_2$ positioned adjacent to the n-type thermoelectric element $13_2$ for connecting these thermoelectric elements $13_2$ and $12_2$ in series. The first electrode members $14_1$ to $14_4$ and the second electrode members $15_1$ to $15_3$ are arranged deviant from each other by a single element. In this fashion, the p-type thermoelectric elements $12_1$ to $12_3$ and the n-type thermoelectric elements $13_1$ to $13_3$ are electrically connected in series.

In the present invention, each of the first electrode members $14_1$ to $14_4$ and the second electrode members $15_1$ to $15_3$ containing an iron-based electrode material, e.g., an iron-based metallic material. It is desirable to use a martensite series stainless steel represented by JIS SUS410 having a thermal expansion coefficient of $10.3 \times 10^{-6}/°C$. as the iron-based metallic material. However, it is also possible to use, for example, a carbon steel or an alloy steel as the iron-based metallic material as far as the thermal expansion coefficient of the iron-based metallic material falls within a range of between $8 \times 10^{-6}/°C$. and $16 \times 10^{-6}/°C$.

It is possible to form each of the first electrode members $14_1$ to $14_4$ and the second electrode members $15_1$ to $15_3$ by, for example, vapor deposition or flame spraying. Particularly, it is most desirable to use a plate of an iron-based material as the electrode member. In order to achieve a stronger bonding in bonding the electrode member to the Co—Sb series thermoelectric element, it is desirable to cover the surface of the electrode with a bonding layer containing at least one transition metal selected from the group consisting of Ag, Au and Cu. The bonding layer can be formed by, for example, a vapor deposition or a sputtering method. However, it is more desirable to employ an electroplating method because the electroplating method can be performed easily.

A first alloy layer 16a containing at least one alloy selected from the group consisting of Ag—Sb, Au—Sb and Cu—Sb is formed between the p-type and n-type thermoelectric elements $12_1$ to $12_3$ and $13_1$ to $13_3$ and the first electrode members $14_1$ to $14_4$. A second alloy layer 16b containing at least one alloy selected from the group consisting of Ag—Sb, Au—Sb and Cu—Sb is formed between the p-type and n-type thermoelectric elements $12_1$ to $12_3$ and $13_1$ to $13_3$ and the second electrode members $15_1$ to $15_3$. It is desirable for the transition metal elements contained in at least one of the first alloy layer 16a and the second alloy layer 16b to be equal partly or entirely to the transition metal elements contained in the bonding layer.

In the case of using the first alloy layer 16a and the second alloy layer 16b, an alloy layer containing at least one alloy selected from the group consisting of Ag—Sb, Au—Sb and Cu—Sb is formed between the electrode member containing the iron-based material and the thermoelectric element containing the Co—Sb series material so as to further improve the bonding strength between the electrode member and the thermoelectric element. It follows that it is possible to minimize the thermal loss and the electrical loss at the bonding interface.

In general, a lower insulating heat conductive plate 17, which is commonly connected to the first electrode members $14_1$ to $14_4$, is arranged on the outside of the first electrode members $14_1$ to $14_4$. On the other hand, an upper insulating heat conductive plate 18, which is commonly connected to the second electrode members $15_1$ to $15_3$, is arranged on the outside of the second electrode members $15_1$ to $15_3$. It is possible for each of the lower insulating heat conductive plate 17 and the upper insulating heat conductive plate 18 to be formed of a ceramic material, preferably aluminum nitride, silicon nitride, silicon carbide or alumina, which have a high heat conductivity. A frit glass layer 19 is interposed between the first electrode members $14_1$ to $14_4$ and the lower insulating heat conductive plate 17 and between the second electrode members $15_1$ to $15_3$ and the upper insulating heat conductive plate 18. As a result, satisfactory bonding can be achieved between the insulating heat conductive plates and the electrode members.

If a temperature difference is imparted between the upper insulating heat conductive plate 18 and the lower insulating heat conductive plate 17 in the thermoelectric module 11 constructed as shown in FIG. 3 such that a low temperature side (L) is formed on the upper insulating heat conductive plate 18 and a high temperature side (H) is formed on the lower insulating heat conductive plate 17, a potential difference is generated between the first electrode members $14_1$ to $14_4$ and the second electrode members $15_1$ to $15_3$. If a load is connected between the terminals of the electrodes, it is possible to obtain electric power.

The thermoelectric module of the present invention can be incorporated in a heat exchanger.

The heat exchanger is an apparatus in which two fluids differing from each other in temperature are brought into contact directly or indirectly so as to exchange heat between the two fluids. It is possible to obtain electric power by heating one of the insulating heat conductive plates, e.g., the lower insulating heat conductive plate, included in the thermoelectric module with the high temperature fluid and by cooling the other insulating heat conductive plate, e.g., the upper insulating heat conductive plate, included in the thermoelectric module with the low temperature fluid.

To be more specific, the heat exchanger of the present invention, in which a heat exchange is performed between a high temperature fluid and a low temperature fluid, comprises a thermoelectric module arranged between the passageway of the high temperature fluid and the passageway of the low temperature fluid.

The thermoelectric module incorporated in the heat exchanger of the present invention comprises:

a plurality of p-type thermoelectric elements each comprising a p-type semiconductor having a skutterdite crystal structure, each of said p-type thermoelectric elements having a first surface and a second surface;

a plurality of n-type thermoelectric elements each comprising a n-type semiconductor having a skutterdite crystal structure, each of said n-type thermoelectric elements having a first surface and a second surface, and said p-type thermoelectric elements and said n-type thermoelectric elements being arranged alternately;

at least one first electrode and at least one second electrode connecting said p-type thermoelectric elements and said n-type thermoelectric elements in series, said at least one first electrode heated by the fluid passageway of said high temperature fluid, and said second at least one electrode cooled by the fluid passageway of said low temperature fluid;

at least one first alloy layer for bonding said at least one first electrode to said first surface of said one p-type thermoelectric element and to said first surface of said one n-type thermoelectric element adjacent to said one p-type thermoelectric element; and at least one second alloy layer for bonding said at least one second electrode to said second surface of said one p-type thermoelectric element and to said second surface of said one n-type thermoelectric element adjacent to said one p-type thermoelectric element, wherein said at least one first alloy layer and said at least one second alloy layer contain Sb and at least one transition metal element selected from the group consisting of Ag, Au and Cu.

The heat exchanger of the present invention will now be described with reference to FIG. 4. To be more specific, FIG. 4 is a cross-sectional view schematically showing the construction of a heat exchanger according to the embodiment of the present invention.

Figure 4:
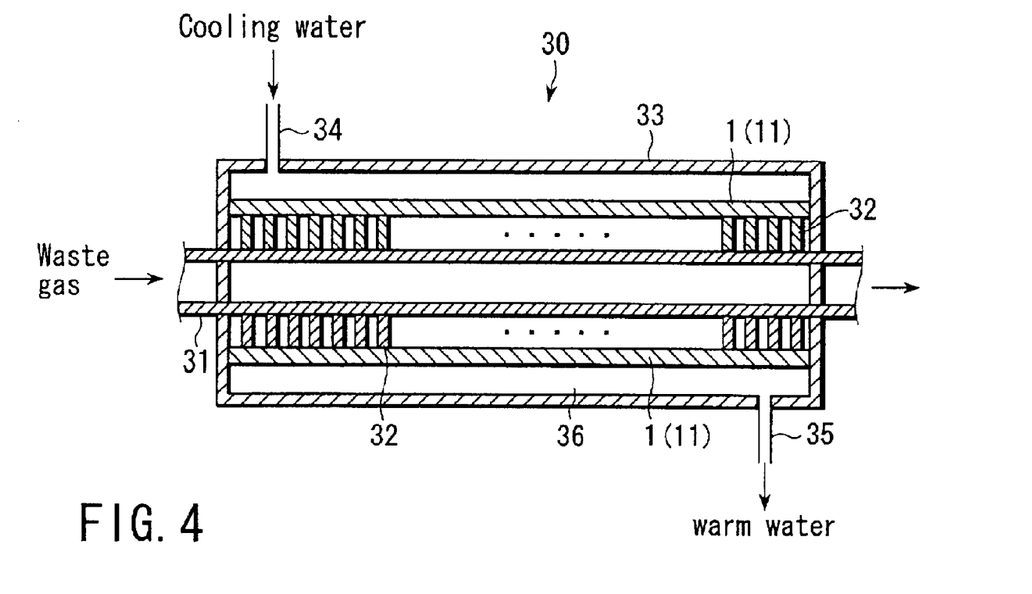
FIG. 4 is a cross-sectional view schematically showing the construction of a heat exchanger according to one embodiment of the present invention.

As shown in FIG. 4, the heat exchanger 30 comprises a gas passageway 31 arranged in the central portion. A large number of heat exchange fins 32 are arranged around the gas passageway 31. The thermoelectric module 1 constructed as shown in, for example, FIG. 1 is arranged close to the heat exchange fins 32. The thermoelectric module 1 and the heat exchange fins 32 are surrounded by an envelope 33. A passageway 36 of, for example, water extending from an inlet pipe 34 to reach a discharge pipe 35 is arranged between the envelope 33 and the thermoelectric module 1.

In the heat exchanger 30 of the construction described above, a high temperature waste gas generated from, for example, a rubbish burning furnace is introduced into the gas passageway 31. On the other hand, a cooling water is introduced through the inlet pipe 34 into a fluid passageway 36. The high temperature waste gas is deprived of the heat by the heat exchange fins 32 so as to warm the water flowing within the fluid passageway 36, with the result that warm water is obtained from the discharge pipe 35. In this case, one of the insulating heat conductive plates included in the thermoelectric module is cooled by the water flowing within the fluid passageway 36 so as to form a low temperature side. The other insulating heat conductive plate is heated by the high temperature waste gas flowing within the gas passageway 31 so as to form a high temperature side. It follows that it is possible to obtain electric power corresponding to the temperature difference from the thermoelectric module 1.

In the heat exchanger shown in FIG. 4, it is possible to use the thermoelectric module 11 shown in FIG. 3 in place of the thermoelectric module 1.

An example of a rubbish burning facility equipped with a heat exchanger of the present invention will now be described with reference to FIG. 5.

Figure 5:
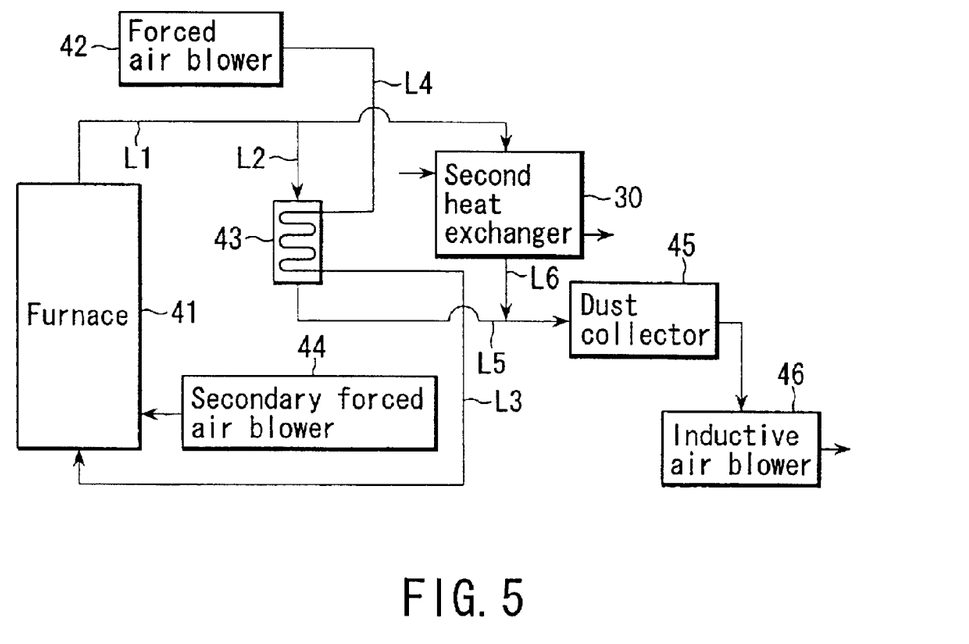
FIG. 5 schematically shows the construction of a rubbish burning facility equipped with a heat exchanger according to one embodiment of the present invention.

As shown in FIG. 5, the rubbish burning facility comprises a rubbish burning furnace 41, a forced air blower 42, a first heat exchanger 43 for heating the combustion air supplied from the force air blower 42 into the rubbish burning furnace, a secondary forced air blower 44, a second heat exchanger 30, which is constructed as shown in FIG. 4, for performing the thermoelectric function by using the waste gas supplied from the rubbish burning furnace 41, a dust collector 45 for cleansing the waste gases generated from the first heat exchanger 43 and the second heat exchanger 30, and an inductive air blower 46 for circulating the waste gas.

In the rubbish burning facility of the construction described above, the high temperature waste gas generated from the rubbish burning furnace 41 flows partly into the first heat exchanger 43 through a line L1 and a branched line L2. On the other hand, the air is introduced from the forced air blower 42 into the first heat exchanger 43 through a line L4. The air introduced into the first heat exchanger 43 is heated by the high temperature waste gas and, then, introduced into the bottom portion of the rubbish burning furnace 41 through a line L3.

The remaining high temperature waste gas is introduced into the second heat exchanger 30 through a waste gas line L1. As described previously, water is heated by the waste gas in the heat exchanger 30 so as to obtain warm water. At the same time, electric power can be generated by the thermoelectric module.

The waste gas after the heat exchange within the first heat exchanger 43 flows into the dust collector 45 through a line L5 so as to have the dust removed therefrom. On the other hand, the waste gas after the heat exchange within the second heat exchanger 30 flows into the dust collector 45 through a line L6 and the line L5 referred to above. The waste gas cleansed within the dust collector 45 is discharged to the outside of the system. Incidentally, the inductive air blower 46 serves to promote the circulation within the system of the waste gas generated from the rubbish burning furnace 41.

Further, the thermoelectric module of the present invention can also be mounted to a water pipe arranged within a boiler included in a steam power generating facility or on the fin surface of the water pipe such that one of the insulating heat conductive plates is heated by the water pipe within the boiler so as to form a high temperature side and the other insulating heat conductive plate is cooled by the water pipe so as to form a low temperature side. In this case, steam can be blown by a steam turbine. In addition, it is possible to obtain electric power. It follows that it is possible to improve the efficiency of the steam power generation facility.

Some Examples of the present invention will now be described with reference to the accompanying drawings.

EXAMPLE 1

<Preparation of P-Type Thermoelectric Element>

Prepared as raw materials were Co metal having a purity of 99.998%, Sb metal having a purity of 99.999%, Ce metal having a purity of 99.99%, and Fe metal having a purity of 99.99%. These metals were weighed to form a composition of $Ce(Fe_{0.75}Co_{0.25})_4Sb_{12}$, though Sb was weighed in an amount larger by 3% by weight than the stoichiometric amount in view of the evaporation in the subsequent arc melting process.

The weighed raw materials were loaded in a hearth made of copper and cooled by water in an arc furnace, followed by evacuating the furnace to a vacuum of $2\times10^{-3}$ Pa and subsequently introducing a high purity Ar gas having a purity of 99.999% into the furnace so as to set up a reduced Ar gas atmosphere of 60 kPa. Then, the weighed raw materials were subjected to an arc melting.

The melting materials were rapidly cooling by the copper hearth cooled by water so as to obtain a metal lump. The metal lump was put in a quartz tube and sealed in a high vacuum not higher than $10^{-4}$ Pa. Under this condition, the metal lump was subjected to a heat treatment at 973K for 30 hours. The resultant metal lump was pulverized in a nitrogen gas atmosphere and molded with a pressure of 100 MPa by using a mold having an inner diameter of 20 mm.

The molded body was loaded in a carbon mold having an inner diameter of 20 mm and subjected to a press sintering treatment under a pressure of 100 MPa, and a temperature of 680° C. for one hour in an Ar gas atmosphere so as to obtain as a p-type thermoelectric element a disk-like sintered body having a diameter of 20 mm, i.e., a p-type semiconductor body having a filled skutterudite crystal structure.

The p-type semiconductor body thus obtained was found to have a resistivity at 400° C. of $1.5\times10^{-3}$ Ωcm, a Seebeck coefficient of 215 $\mu$V/K, and a heat conductivity of 1.5 W/mK.

<Preparation of N-Type Thermoelectric Element>

Prepared as raw materials were Co metal having a purity of 99.998%, Sb metal having a purity of 99.999%, Ce metal having a purity of 99.99%, and Pd metal having a purity of 99.99%. These metals were weighed to form a composition of $Ce_{0.2}(Pd_{0.03}Co_{0.97})_4Sb_{12}$, though Sb was weighed in an amount larger by 3% by weight than the stoichiometric amount in view of the evaporation in the subsequent arc melting process.

The weighed raw materials were loaded in a hearth made of copper and cooled by water in an arc furnace, followed by evacuating the furnace to a vacuum of $2\times10^{-3}$ Pa and subsequently introducing a high purity Ar gas having a purity of 99.999% into the furnace so as to set up a reduced Ar gas atmosphere of 60 kPa. Then, the weighed raw materials were subjected to arc melting.

The melting materials were rapidly cooling by the copper hearth cooled by water so as to obtain a metal lump. The metal lump was put in a quartz tube and sealed in a high vacuum not higher than $10^{-4}$ Pa. Under this condition, the metal lump was subjected to a heat treatment at 973K for 30 hours. The resultant metal lump was pulverized in a nitrogen gas atmosphere and molded with a pressure of 100 MPa by using a mold having an inner diameter of 20 mm.

The molded body was loaded in a carbon mold having an inner diameter of 20 mm and subjected to a press sintering treatment under a pressure of 100 MPa, and a temperature of 680° C. for one hour in an Ar gas atmosphere so as to obtain as n-type thermoelectric element a disk-like sintered body having a diameter of 20 mm, i.e., an n-type semiconductor body having a filled skutterudite crystal structure.

The n-type thermoelectric element thus obtained was found to have a resistivity at 400° C. of $1.1\times10^{-3}$ Ωcm, a Seebeck coefficient of $-250$ $\mu$V/K, and a heat conductivity of 3.6 W/mK.

<Preparation of Thermoelectric Module>

Figure 6:
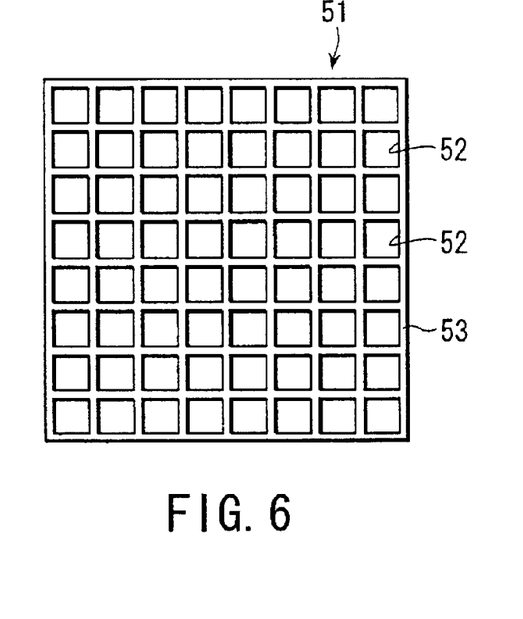
FIG. 6 is a plan view schematically showing a mesh made of cordierite ceramics, which was used for manufacturing the thermoelectric module for Example 1 of the present invention.
Figure 7:
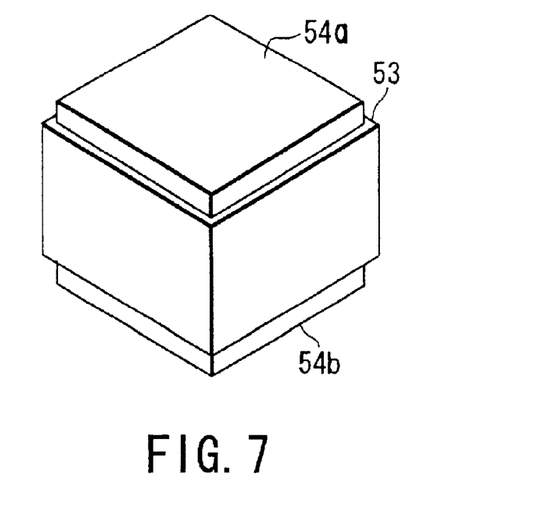
FIG. 7 schematically shows the positional relationship between the thermoelectric element and the mesh made of cordierite ceramics, which are used for preparing the thermoelectric module for Example 1 of the present invention.

A cube having a side of 2 mm was cut out of each of the p-type semiconductor body and the n-type semiconductor body thus prepared. On the other hand, prepared was a mesh 51 having openings 52 as shown in FIG. 6. The mesh 51 was made of cordierite ceramics and sized at 17.4 mm×17.4 mm×1.5 mm. The opening 52 of the mesh 51 was sized at 2 mm×2 mm. Also, the lattice 53 partitioning the adjacent openings 52 had a thickness of 0.2 mm. The p-type semiconductor body and the n-type semiconductor body were alternately arranged in 64 openings 52 of the cordierite ceramics mesh 51 arranged to form 8 rows and 8 columns. In this case, four sets of the p-type semiconductor body and the n-type semiconductor body were arranged to form a single row, and eight rows of this construction were arranged side by side in the width direction of the row so as to form 32 sets of the p-type semiconductor body and the n-type semiconductor body. Also, the upper and lower surfaces 54a, 54b of each semiconductor body were allowed to project from the mesh as shown in FIG. 7.

In the next step, a paste was prepared by mixing a Ag metal power of 325 meshes and an Sb metal powder of 325 meshes in a molar ratio Ag:Sb of 51:49 (eutectic composition), followed by kneading the mixture with acetone added to the mixture as an organic solvent.

Figure 8:
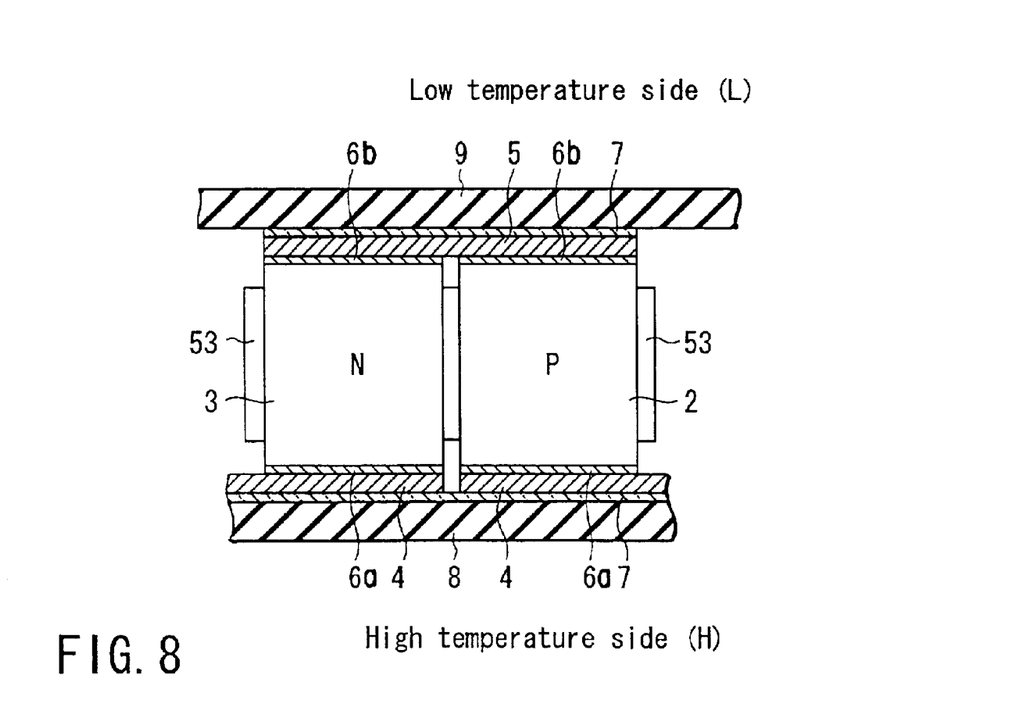
FIG. 8 is a cross-sectional view schematically showing the construction of the thermoelectric module for Example 1 of the present invention.

Each of a first brazing filler metal layer 6a having a thickness of 100 $\mu$m and a second brazing filler metal layer 6b having a thickness of 100 $\mu$m was formed by coating the upper (second) and lower (first) surfaces of each of the n-type thermoelectric element and the p-type thermoelectric element with the paste thus prepared. Prepared were silver electrode plates each sized at 4.3 mm×2.0 mm×0.6 mm as a first electrode 4 and a second electrode 5. These first electrode 4 and second electrode 5 were arranged such that the n-type thermoelectric element 3 and the p-type thermoelectric element 2 were allowed to be connected in series.

A frit glass layer 7 was formed by coating the surface of each of the first electrode 4 and the second electrode 5 with a frit glass powder. Also, a first insulating heat conductive plate 8 formed of an AlN plate sized at 24 mm×24 mm×1 mm was formed to cover the entire frit glass layer 7 formed on the first electrode 4. On the other hand, a second insulating heat conductive plate 9 formed of an AlN plate sized at 24 mm×24 mm×1 mm was formed to cover the entire frit glass layer 7 formed on the second electrode 5.

The resultant laminate structure was arranged in an electric furnace with a weight of 3 kg put on the laminate structure so as to carry out a heat treatment at 550° C. for one hour in an Ar gas atmosphere. After the cooling, the laminate structure was taken out of the electric furnace so as to obtain a thermoelectric module having all the layers bonded to each other with a sufficiently high mechanical strength.

Since all the layers of the thermoelectric module were bonded to each other with a sufficiently high mechanical strength, the module was found to have a sufficiently low internal resistance of 0.8Ω.

The thermoelectric characteristics of the thermoelectric module were measured under the matched load conditions that a load of 0.8Ω, which was equal to the internal resistance of the thermoelectric module, was connected to the module with the temperature on the high temperature side of the module set at 425° C. and the temperature on the low temperature side of the module set at 25° C. A voltage of 2.3 V was found to be generated, and a current of 2.9 A was found to flow through the module. It follows that the power obtained was 6.8 W. After the thermoelectric module was continuously operated for about 1,000 hours under the conditions given above, the temperature of the module was brought back to room temperature, followed by operating again the module under the same conditions. The thermoelectric performance of the module remained substantially unchanged even after these operations were repeated 10 times to allow the total operating time to reach about 10,000 hours. Also, breakage or deformation of the module were scarcely recognized.

EXAMPLES 2 to 5

A thermoelectric module was prepared substantially as in Example 1, except that the molar ratios of Sb and Ag in the alloy forming the brazing filler metal layer and the heat treating temperature of the laminate structure were changed as shown in Table 1.

COMPARATIVE EXAMPLE 1

A thermoelectric module was prepared as in Example 1 described previously, except that an Sb metal layer was used as the brazing filler metal material layer.

COMPARATIVE EXAMPLE 2

A thermoelectric module was prepared as in Example 1 described previously, except that a Ag metal layer was used as the brazing filler metal material layer.

The internal resistance, the voltage, the current and the power for the thermoelectric module for each of Examples 2 to 5 and Comparative Examples 1 to 2 were measured as in Example 1, with the result as shown in Table 1.

After the thermoelectric module for each of Examples 2 to 5 was continuously operated for about 1,000 hours under the conditions equal to those for Example 1, the temperature of the module was brought back to room temperature, followed by operating again the module under the same conditions. The performance of the module remained substantially unchanged even after these operations were repeated 10 times to allow the total operating time to reach about 10,000 hours. Also, breakage or deformation of the module was scarcely recognized.

In contrast, the bonding strength between the electrode and the thermoelectric element was low in the thermoelectric module for Comparative Example 1 and, thus, the thermoelectric module for Comparative Example 1 is high in the internal resistance and low in the thermoelectromotive force, compared with the thermoelectric module for each of Examples 1 to 5. On the other hand, it was impossible to bond the electrode to the thermoelectric element in the thermoelectric module for Comparative Example 2, resulting in failure to evaluate the thermoelectric characteristics.

Further, the composition of the alloy layer included in the thermoelectric module for each of Examples 1 to 5 was measured by an energy dispersive X-ray spectroscopy (EDX). It has been found that the molar ratio of Ag and the molar ratio of Sb are changed in the thickness direction of the alloy layer such that the molar ratio of Ag is increased toward the electrode side and the molar ratio of Sb is increased toward the thermoelectric element side. Also, the molar ratio of Ag at the interface between the alloy layer and the electrode was found to be higher than that at the interface between the alloy layer and the thermoelectric element. It should be noted that the alloy layer is formed of a binary alloy. It follows that, if the molar ratio of Ag on the side of the electrode is higher than that on the side of the thermoelectric element, the molar ratio of Sb at the interface between the alloy layer and the thermoelectric element is rendered higher than that in the interface between the alloy layer and the electrode.

EXAMPLE 6

<Preparation of P-Type Thermoelectric Element>

Prepared as raw materials were Co metal having a purity of 99.998%, Sb metal having a purity of 99.999%, Ce metal

TABLE 1

| | Sb (mol %) | Ag (mol %) | Heat treating temperature (° C.) | Internal resistance (Ω) | Voltage (V) | Current (A) | Power (W) |
|---|---|---|---|---|---|---|---|
| Example 1 | 41 | 59 | 550 | 0.8 | 2.3 | 2.9 | 6.8 |
| Example 2 | 30 | 70 | 600 | 0.78 | 2.2 | 2.8 | 6.2 |
| Example 3 | 50 | 50 | 550 | 0.82 | 2.3 | 2.9 | 6.6 |
| Example 4 | 70 | 30 | 600 | 0.85 | 2.4 | 2.8 | 6.8 |
| Example 5 | 90 | 10 | 650 | 0.91 | 2.4 | 2.6 | 6.3 |
| Comparative Example 1 | 100 | 0 | 700 | 1.5 | 2.4 | 1.6 | 3.8 |
| Comparative Example 2 | 0 | 100 | 700 | — | — | — | — |

As apparent from Table 1, it is possible to obtain a satisfactory bonding strength between the thermoelectric element assembly and the silver electrodes even in the case where silver and antimony contained in the alloy fail to form a eutectic composition. In other words, according to the thermoelectric module according to each of Examples 2 to 5, it is possible to obtain a low internal resistance and a high thermoelectromotive force under high temperatures not lower than 300° C. so as to make it possible to realize a satisfactory thermoelectric characteristics even under high temperatures not lower than 300° C.

having a purity of 99.99%, and Fe metal having a purity of 99.99%. These metals were weighed to form a composition of $Ce(Fe_{0.75}Co_{0.25})_4Sb_{12}$, though Sb was weighed in an amount larger by 3% by weight than the stoichiometric amount in view of the evaporation in the subsequent arc melting process.

The weighed raw materials were loaded in a hearth made of copper and cooled by water in an arc furnace, followed by evacuating the furnace to a vacuum of $2\times10^{-3}$ Pa and subsequently introducing a high purity Ar gas having a purity of 99.999% into the furnace so as to set up a reduced Ar gas atmosphere of 60 kPa. Then, the weighed raw materials were subjected to arc melting.

The melting materials were rapidly cooling by the copper hearth cooled by water so as to obtain a metal lump. The metal lump was put in a quartz tube and sealed in a high vacuum not higher than $10^{-4}$ Pa. Under this condition, the metal lump was subjected to a heat treatment at 973K for 30 hours. The resultant metal lump was pulverized in a nitrogen gas atmosphere and molded with a pressure of 100 MPa by using a mold having an inner diameter of 20 mm.

The molded body was loaded in a carbon mold having an inner diameter of 20 mm and subjected to a press sintering treatment under a pressure of 100 MPa and a temperature of 680° C. for one hour in an Ar gas atmosphere so as to obtain a disk-like sintered body having a diameter of 20 mm, i.e., a p-type semiconductor body having a filled skutterudite crystal structure as p-type thermoelectric element. The p-type semiconductor body thus obtained was found to have a resistivity at 400° C. of $1.5 \times 10^{-3}$ Ωcm, a Seebeck coefficient of 215 $\mu$V/K, and a heat conductivity of 1.5 W/mK.

<Preparation of N-Type Thermoelectric Element>

Prepared as raw materials were Co metal having a purity of 99.998%, Sb metal having a purity of 99.999%, Ce metal having a purity of 99.99%, and Pd metal having a purity of 99.99%. These metals were weighed to form a composition of $Ce_{0.2}(Pd_{0.03}Co_{0.97})_4Sb_{12}$, though Sb was weighed in an amount larger by 3% by weight than the stoichiometric amount in view of the evaporation in the subsequent arc melting process.

The weighed raw materials were loaded in a hearth made of copper and cooled by water in an arc furnace, followed by evacuating the furnace to a vacuum of $2 \times 10^{-3}$ Pa and subsequently introducing a high purity Ar gas having a purity of 99.999% into the furnace so as to set up a reduced Ar gas atmosphere of 60 kPa. Then, the weighed raw materials were subjected to arc melting.

The melting materials were rapidly cooling by the copper hearth cooled by water so as to obtain a metal lump. The metal lump was put in a quartz tube and sealed in a high vacuum not higher than $10^{-4}$ Pa. Under this condition, the metal lump was subjected to a heat treatment at 973K for 30 hours. The resultant metal lump was pulverized in a nitrogen gas atmosphere and molded with a pressure of 100 MPa by using a mold having an inner diameter of 20 mm.

The molded body was loaded in a carbon mold having an inner diameter of 20 mm and subjected to a press sintering treatment under a pressure of 100 MPa and a temperature of 680° C. for one hour in an Ar gas atmosphere so as to obtain a disk-like sintered body having a diameter of 20 mm, i.e., an n-type semiconductor having a filled skutterudite crystal structure as n-type thermoelectric element. The n-type semiconductor body thus obtained was found to have a resistivity at 400° C. of $1.1 \times 10^{-3}$ Ωcm, a Seebeck coefficient of -250 $\mu$V/K, and a heat conductivity of 3.6 W/mK.

<Preparation of Electrodes>

A plate of SUS410 (JIS standards) having a thermal expansion coefficient of $10.3 \times 10^{-6}/°$ C. was cut into a piece sized at 4.1 mm×2.0 mm×0.6 mm so as to prepare a electrode. The surface of the electrode thus prepared was etched with a dilute hydrochloric acid so as to improve the bonding strength of the plating formed later on the electrode. Then, the SUS410 substrate was put in a basket of a metal mesh, and the basket housing the electrode was put in a copper ion solution so as to form a copper electroplating film in a thickness of about 1 $\mu$m as an underlying layer. Further, the electrode was put in a $NaAg(CN)_2$ solution so as to form a silver electroplating film in a thickness of about 10 $\mu$m, thereby forming a bonding layer including a Cu layer and a Ag layer and having a thickness of 11 $\mu$m on the entire surface of the electrode. The electrodes thus obtained were used as the first electrode and as the second electrode.

<Preparation of Thermoelectric Module>

A cube having a side of 2 mm was cut out of each of the p-type semiconductor body and the n-type semiconductor body prepared as described above. On the other hand, prepared as a member for determining the position of the thermoelectric element was a mesh made of cordierite ceramics and sized at 17.4 mm×17.4 mm×1.5 mm. The opening of the mesh was sized at 2 mm×2 mm. Also, the lattice partitioning the adjacent openings had a thickness of 0.2 mm. The p-type thermoelectric element and the n-type thermoelectric element were alternately arranged in 64 openings of the cordierite ceramics mesh arranged to form 8 rows and 8 columns. In this case, four sets of the p-type thermoelectric element and the n-type thermoelectric element were arranged to form a single row, and eight rows of this construction were arranged side by side in the width direction of the row so as to form 32 sets of the p-type thermoelectric element and the n-type thermoelectric element. Also, the upper and lower surfaces of each thermoelectric element were allowed to project from the mesh.

In the next step, a paste was prepared by mixing a Ag metal power of 325 meshes and an Sb metal powder of 325 meshes in a molar ratio Ag:Sb of 51:49, followed by kneading the mixture with acetone added to the mixture as an organic solvent.

Each of a first brazing filler metal layer having a thickness of 100 $\mu$m and a second brazing filler metal layer having a thickness of 100 $\mu$m was formed by coating the upper (second) and lower (first) surfaces of each of the n-type thermoelectric element and the p-type thermoelectric element with the paste thus prepared, followed by arranging a first electrode and a second electrode such that the n-type thermoelectric element and the p-type thermoelectric element were allowed to be connected in series.

A frit glass layer was formed by coating the surface of each of the first electrode and the second electrode with a frit glass powder. Also, a first insulating heat conductive plate formed of an AlN plate sized at 24 mm×24 mm×1 mm was formed to cover the entire frit glass layer formed on the first electrode. On the other hand, a second insulating heat conductive plate formed of an AlN plate sized at 24 mm×24 mm×1 mm was formed to cover the entire frit glass layer formed on the second electrode.

The resultant laminate structure was disposed in an electric furnace with a weight of 3 kg put on the laminate structure so as to carry out a heat treatment at 600° C. for one hour in an Ar gas atmosphere. After the cooling, the laminate structure was taken out of the electric furnace so as to obtain a thermoelectric module having all the layers bonded to each other with a sufficiently high mechanical strength.

The thermoelectric characteristics of the thermoelectric module were measured under the matched load conditions that a load of resistance equal to the internal resistance of the thermoelectric module was connected to the module with the temperature on the high temperature side of the module set at 500° C. and the temperature on the low temperature side of the module set at 25° C. A voltage of 3.6 V and power of 11 W were found to be generated. After the thermoelectric module was continuously operated for about 1,000 hours under the conditions given above, the temperature of the module was brought back to room temperature, followed by operating again the module under the same conditions. The thermoelectric performance of the module remained substantially unchanged even after these operations were repeated 10 times to allow the total operating time to reach about 10,000 hours. Also, breakage or deformation of the module was scarcely recognized.

EXAMPLE 7

A thermoelectric module was prepared as in Example 6 described previously, except that used was a brazing filler metal material layer having a composition shown as sample A in Table 2.

EXAMPLES 8 TO 10

A thermoelectric module was prepared as in Example 7, except that each of samples B to D shown in Table 2 was used to form the brazing filler metal layer in place of sample A used in Example 7. Incidentally, Table 2 shows "Sample A, Ag: 55, Sb: 45". This implies that the brazing filler metal layer for sample A is formed of a mixture containing 55 mol % of Ag and 45 mol % of Sb.

EXAMPLE 11

A thermoelectric module was prepared as in Example 6 described previously, except that a bonding layer including a Cu layer and a Au layer and having a thickness of 11 $\mu$m was formed on the entire surface of the electrode by applying an underlying plating of Cu to a electrode similar to that described previously in conjunction with Example 6, followed by plating Au in place of the Ag plating in a thickness of 10 $\mu$m on the Cu plating layer, and that sample E was used in place of sample A for forming the brazing filler metal layer.

EXAMPLES 12 TO 14

A thermoelectric module was formed as in Example 11, except that each of samples F to H was used for forming the brazing filler metal layer in place of sample E.

EXAMPLE 15

A thermoelectric module was prepared as in Example 6 described previously, except that a bonding layer including a Cu layer having a thickness of 11 $\mu$m was formed on the entire surface of the electrode by applying an underlying plating of Cu to a electrode similar to that described previously in conjunction with Example 6, followed by plating Cu in place of the Ag plating in a thickness of 10 $\mu$m on the Cu plating layer, and that sample I was used in place of sample A for forming the brazing filler metal layer.

EXAMPLES 16 TO 18

A thermoelectric module was formed as in Example 15, except that each of samples J to L was used for forming the brazing filler metal layer in place of sample I.

COMPARATIVE EXAMPLES 3 TO 4

A thermoelectric module was formed as in Example 7, except that each of samples M to N was used for forming the brazing filler metal layer in place of sample A.

EXAMPLES 19 TO 30

A thermoelectric module was formed as in Examples 7 to 18, except that a Ti—Fe based alloy having a thermal expansion coefficient of $8 \times 10^{-6}/°$ C. was used for forming the electrode.

COMPARATIVE EXAMPLES 5 TO 6

A thermoelectric module was formed as in Example 19, except that each of samples M to N was used for forming the brazing filler metal layer in place of sample A.

EXAMPLES 31 TO 42

A thermoelectric module was formed as in Examples 7 to 18, except that an austenite series stainless steel JIS 304 having a thermal expansion coefficient of $16 \times 10^{-6}/°$ C. was used for forming the electrode.

COMPARATIVE EXAMPLES 7 TO 8

A thermoelectric module was formed as in Example 31, except that each of samples M to N was used for forming the brazing filler metal layer in place of sample A.

EXAMPLES 43 TO 54

A thermoelectric module was formed as in Examples 7 to 18, except that molybdenum having a thermal expansion coefficient of $6 \times 10^{-6}/°$ C. was used for forming the electrode.

COMPARATIVE EXAMPLES 9 TO 10

A thermoelectric module was formed as in Example 43, except that each of samples M to N was used for forming the brazing filler metal layer in place of sample A.

EXAMPLES 55 TO 66

A thermoelectric module was formed as in Examples 7 to 18, except that silver having a thermal expansion coefficient of $20 \times 10^{-6}/°$ C. was used for forming the electrode.

COMPARATIVE EXAMPLES 11 TO 12

A thermoelectric module was formed as in Example 55, except that each of samples M to N was used for forming the brazing filler metal layer in place of sample A.

Table 2 shows the kinds of the brazing filler metal layers and the thermal expansion coefficients of the substrates used in EXAMPLES 7 to 66 and Comparative Examples 3 to 12.

A continuous operation test described below was repeated 10 times for the thermoelectric module in each of Examples 7 to 66 and Comparative Examples 3 to 12 so as to evaluate the thermoelectric performance after 10,000 hours of the total operating time, with the result as shown in Table 3. The thermoelectric performance higher than 90% after 10,000 hours of the total operation time was evaluated as $a_1$. The thermoelectric performance falling within a range of between 80% and 90% after repetition of the continuous operation test 10 times was evaluated as $a_2$. The thermoelectric efficiency not lower than 50% and lower than 80% after 10,000 hours of the total operation time was evaluated as b. The thermoelectric efficiency not lower than 30% and lower than 50% after 10,000 hours of the total operation time was evaluated as c. Further, the thermoelectric efficiency lower than 30% after 10,000 hours of the total operation time was evaluated as d. It was impossible to bond the electrode to the thermoelectric element in the thermoelectric module for Comparative Examples 4, 6, 8, 10 and 12, resulting in failure to evaluate the thermoelectric characteristics.

In the continuous operation test noted above, the thermoelectric module was continuously operated for 1,000 hours under the matched load condition that a load of resistance equal to the internal resistance of the module was connected to the module with the temperature on the high temperature side set at 500° C. and the temperature on the low temperature side set at 25° C., followed by bringing the module temperature back to room temperature.

that the electrode, the thermoelectric element and the mixed brazing filler metal layer containing Sb and at least one element selected from the group consisting of Ag, Au and Cu can be bonded via a liquid phase under temperatures not higher than 618° C. under which the filled skutterudite series

TABLE 2

| Composition of brazing filler metal layer (mol ratio) | | | Thermal expansion coefficient of electrode (/° C.) | | | | |
|---|---|---|---|---|---|---|---|
| | | | $6 \times 10^{-6}$ | $8 \times 10^{-6}$ | $10 \times 10^{-6}$ | $16 \times 10^{-6}$ | $20 \times 10^{-6}$ |
| Sample A | Ag:55 | Sb:45 | Example 43 | Example 19 | Example 7 | Example 31 | Example 55 |
| Sample B | Ag:59 | Sb:41 | Example 44 | Example 20 | Example 8 | Example 32 | Example 56 |
| Sample C | Ag:60 | Sb:40 | Example 45 | Example 21 | Example 9 | Example 33 | Example 57 |
| Sample D | Ag:63 | Sb:37 | Example 46 | Example 22 | Example 10 | Example 34 | Example 58 |
| Sample E | Au:75 | Sb:25 | Example 47 | Example 23 | Example 11 | Example 35 | Example 59 |
| Sample F | Au:73 | Sb:27 | Example 48 | Example 24 | Example 12 | Example 36 | Example 60 |
| Sample G | Au:30 | Sb:70 | Example 49 | Example 25 | Example 13 | Example 37 | Example 61 |
| Sample H | Au:25 | Sb:75 | Example 50 | Example 26 | Example 14 | Example 38 | Example 62 |
| Sample I | Cu:30 | Sb:70 | Example 51 | Example 27 | Example 15 | Example 39 | Example 63 |
| Sample J | Cu:37 | Sb:63 | Example 52 | Example 28 | Example 16 | Example 40 | Example 64 |
| Sample K | Cu:40 | Sb:60 | Example 53 | Example 29 | Example 17 | Example 41 | Example 65 |
| Sample L | Cu:50 | Sb:50 | Example 54 | Example 30 | Example 18 | Example 42 | Example 66 |
| Sample M | Sb:100 | | Comparative Example 9 | Comparative Example 5 | Comparative Example 3 | Comparative Example 7 | Comparative Example 11 |
| Sample N | Ag:100 | | Comparative Example 10 | Comparative Example 6 | Comparative Example 4 | Comparative Example 8 | Comparative Example 12 |

TABLE 3

| Composition of brazing filler metal layer (mol ratio) | | | Thermal expansion coefficient of electrode (/° C.) | | | | |
|---|---|---|---|---|---|---|---|
| | | | $6 \times 10^{-6}$ | $8 \times 10^{-6}$ | $10 \times 10^{-6}$ | $16 \times 10^{-6}$ | $20 \times 10^{-6}$ |
| Sample A | Ag:55 | Sb:45 | b | $a_2$ | $a_1$ | $a_2$ | c |
| Sample B | Ag:59 | Sb:41 | b | $a_1$ | $a_1$ | $a_1$ | b |
| Sample C | Ag:60 | Sb:40 | b | $a_1$ | $a_1$ | $a_2$ | b |
| Sample D | Ag:63 | Sb:37 | b | $a_1$ | $a_1$ | $a_2$ | c |
| Sample E | Au:75 | Sb:25 | b | $a_2$ | $a_2$ | $a_2$ | c |
| Sample F | Au:73 | Sb:27 | b | $a_2$ | $a_1$ | $a_2$ | b |
| Sample G | Au:30 | Sb:70 | b | $a_2$ | $a_1$ | $a_2$ | b |
| Sample H | Au:25 | Sb:75 | b | $a_2$ | $a_2$ | $a_2$ | c |
| Sample I | Cu:30 | Sb:70 | b | $a_2$ | $a_2$ | $a_2$ | c |
| Sample J | Cu:37 | Sb:63 | b | $a_2$ | $a_2$ | $a_2$ | b |
| Sample K | Cu:40 | Sb:60 | b | $a_2$ | $a_2$ | $a_2$ | b |
| Sample L | Cu:50 | Sb:50 | b | $a_2$ | $a_2$ | $a_2$ | c |
| Sample M | Sb:100 | | d | d | c | d | d |
| Sample N | Ag:100 | | — | — | — | — | — |

As apparent from Tables 2 and 3, the thermoelectric modules for the Examples of the present invention exhibit excellent characteristics.

Specifically, the thermoelectric module for each of Examples 7 to 66 comprises n-type and p-type thermoelectric elements each including a compound having a filled skutterudite crystal structure, an electrode comprising Fe-containing material having a thermal expansion coefficient falling within a range of between $8 \times 10^{-6}/°$ C. and $16 \times 10^{-6}/°$ C., and an alloy layer containing Sb and at least one element selected from the group consisting of Ag, Au and Cu. The thermoelectric module of the particular construction was found to exhibit an improved durability under high temperatures not lower than 300° C.

It should be noted that Ag—Sb has a eutectic temperature of 485° C., Au—Sb has a eutectic temperature of 360° C., and Cu—Sb has a eutectic temperature of 526° C. It follows material can be present stably. As a result, it is possible to obtain a high bonding strength without imparting adverse effects to the thermoelectric characteristics of the element.

It has been confirmed by the energy dispersive X-ray spectroscopy (EDX) that 0.1 mol % of Ce is contained in the alloy layer included in the thermoelectric module for each of Examples 6 to 66. If a heat treatment is applied to the pressurized laminate body, the brazing filler metal layer is melted, and Ce contained in the n-type semiconductor or the p-type semiconductor is melted into the molten brazing filler metal layer. It follows that the alloy layer containing at least 0.1 mol % of Ce permits improving the bonding strength between the thermoelectric element and the electrode, compared with the alloy layer containing Ce in an amount smaller than 0.1 mol %.

Further, the composition of the alloy layer included in the thermoelectric module for each of Examples 6 to 66 was measured by the energy dispersive X-ray spectroscopy (EDX). It was found that the alloy layer was formed of an alloy containing a transition metal element and Sb. Also, it has been found that the molar ratio of transition metal element and the molar ratio of Sb are changed in the thickness direction of the alloy layer such that the molar ratio of transition metal element is increased toward the electrode side and the molar ratio of Sb is increased toward the thermoelectric element side. The molar ratio of transition metal element at the interface between the alloy layer and the electrode was found to be higher than that at the interface between the alloy layer and the thermoelectric element. It should be noted that the alloy layer is formed of a binary alloy. It follows that, if the molar ratio of transition metal element on the side of the electrode is higher than that on the side of the thermoelectric element, the molar ratio of Sb at the interface between the alloy layer and the thermoelectric element is rendered higher than that in the interface between the alloy layer and the electrode.

It has also been found that the life of the thermoelectric module comprising the filled skutterudite series material can be improved, if the thermal expansion coefficient of the electrode material containing Fe falls within a range of between $8\times10^{-6}/°$ C. and $16\times10^{-6}/°$ C. under temperatures ranging between room temperature and 500° C. Particularly, a martensite series stainless steel represented by SUS410 (JIS) has a thermal expansion coefficient of $12\times10^{-6}/°$ C. under temperatures up to 500° C., which is substantially equal to that of the filled skutterudite series material. Such being the situation, it has been found that, in the case of using a martensite series stainless steel for forming the electrode, the thermal stress is not generated. Even if generated, the thermal stress is negligibly small.

On the other hand, where the thermal expansion coefficient of the electrode material fails to fall within a range of between $8\times10^{-6}/°$ C. and $16\times10^{-6}/°$ C., a large difference in the thermal expansion coefficient is generated between the thermoelectric element and the electrode. It should be noted that it is absolutely necessary to provide a large temperature difference in allowing the thermoelectric module to generate an electric power, with the result that a large thermal stress is generated in the module in generating the electric power. It follows that, even if an electrode and a thermoelectric element can be bonded to each other by the brazing filler metal layer, the element or the bonded portion of the element may be broken by the generation of a large thermal stress. In short, the thermoelectric module may fail to exhibit a sufficiently high durability under high temperatures not lower than 300° C.

A heat exchanger was assembled by using the thermoelectric modules for Examples 1 and 6.

(Preparation of Heat Exchanger)

The thermoelectric modules are arranged between a flat plate of a heat-resistant steel and a flat plate of a corrosion-resistant steel, and these flat steel plates were fixed to the thermoelectric modules so as to prepare a laminated plate. In preparing the laminated plate, the output terminals extending from the modules were connected to each other in series. As a result, obtained was a heat exchanger equipped with the thermoelectric modules, with the heat-resistant steel side of the laminated steel forming a high temperature portion (or heating portion) and the corrosion-resistant steel side forming the cooling portion. Incidentally, a fluid passageway 36 for circulating water was arranged on the cooling side of the heat exchanger equipped with the thermoelectric modules.

(Electricity Generation System)

The heat exchangers for Examples 1 and 6 were employed in the electricity generation system mounted on a rubbish burning furnace constructed as shown in FIG. 5 so as to form a boiler that permits obtaining steam and hot water and also permits electricity generation. The heat exchanger for each of Examples 1 and 6 was mounted to a water pipe or to the fin surface of the water pipe inside the boiler of a steam power generation facility such that the heat-resistant flat steel plate was positioned inside the boiler and the cooling water was positioned on the side of the water pipe so as to obtain a steam power generation facility of an improved efficiency that permits obtaining simultaneously both electric power and steam supplied to the steam turbine. To be more specific, the electricity generation efficiency $\eta_A$ of the steam power generation facility that generates electricity by the steam turbine alone is equal to $\eta_T+(1-\eta_T)\eta_P$, i.e., $\eta_A=\eta_T+(1-\eta_T)\eta_P$, where $\eta_T$ represents the thermoelectric efficiency of the heat exchanger. It is possible to improve the electricity generation efficiency by $(1-\eta_{TP})\eta_T$ by mounting a heat exchanger having a thermoelectric efficiency of $\eta_T$ on the steam power generation facility having a power generation efficiency $\eta_P$.

The present invention is not limited to the embodiments described above. To be more specific, it is also possible to apply the technical idea of the present invention to an n-type or p-type thermoelectric element including a Si series or Si—Ge series alloy such as $CrSi_2$, $MnSi_{1.73}$, $FeSi_2$, $CoSi$, $Ru_2Si_3$, $Os_2Si_3$, $Rh_4Si_5$ and $Ir_4Si_5$. Also, in the embodiment described above, the technical idea of the present invention is applied to a flat plate type heat exchanger. However, the shape of the heat exchanger of the present invention is not limited to the flat plate type as in the embodiment described above. It is also possible for the heat exchanger of the present invention to be in the shape of a double cylinder tube in which is arranged a thermoelectric module of the present invention. Further, it is possible to form a boiler equipped with the particular heat exchanger.

As described above in detail, the present invention provides a thermoelectric module exhibiting a high thermoelectric function under high temperatures not lower than about 300° C. and a heat exchanger equipped with the particular thermoelectric module.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermoelectric module, comprising:
    a plurality of p-type thermoelectric elements each comprising a p-type semiconductor having a skutterdite crystal structure, each of said p-type thermoelectric elements having a first surface having a high temperature and a second surface having a temperature lower than that of said first surface;
    a plurality of n-type thermoelectric elements each comprising a n-type semiconductor having a skutterdite crystal structure, each of said n-type thermoelectric elements having a first surface having a high temperature and a second surface having a temperature lower than that of said first surface, and said p-type thermoelectric elements and said n-type thermoelectric elements being arranged alternately;

at least one first electrode and at least one second electrode connecting said p-type thermoelectric elements and said n-type thermoelectric elements in series;

at least one first alloy layer for bonding said at least one first electrode to said first surface of said one p-type thermoelectric element and to said first surface of said one n-type thermoelectric element adjacent to said one p-type thermoelectric element; and at least one second alloy layer for bonding said at least one second electrode to said second surface of said one p-type thermoelectric element and to said second surface of said one n-type thermoelectric element adjacent to said one p-type thermoelectric element, wherein said at least one first alloy layer and said at least one second alloy layer contain Sb and at least one transition metal element selected from the group consisting of Ag, Au and Cu.

2. A thermoelectric module according to claim 1, wherein said at least one first electrode and said at least one second electrode contain at least one transition metal element selected from the group consisting of Ag, a combination of Ag and Au, and a combination of Ag and Cu, and the Ag content of said at least first electrode and the Ag content of said at least one second electrode are at least 50% by weight.

3. A thermoelectric module according to claim 1, wherein said at least one first electrode and said at least one second electrode are formed of an alloy containing Ag, Ag metal, a sintered body of an alloy containing Ag, or a sintered body of Ag metal.

4. A thermoelectric module according to claim 1, wherein said at least one first electrode and said at least one second electrode contain Fe and have a thermal expansion coefficient falling within a range of between $8 \times 10^{-6}/°$ C. and $16 \times 10^{-6}/°$ C.

5. A thermoelectric module according to claim 1, wherein said at least one first electrode and said at least one second electrode contain an austenitic stainless steel and have a thermal expansion coefficient falling within a range of between $8 \times 10^{-6}/°$ C. and $16 \times 10^{-6}/°$ C.

6. A thermoelectric module according to claim 1, wherein said at least one first alloy layer and said at least one second alloy layer have a thickness falling within a range of between 1 µm and 1 mm.

7. A thermoelectric module according to claim 1, wherein at least one of said p-type semiconductor and said n-type semiconductor includes a compound having a filled skutterudite structure in which at least one element selected from the group consisting of La, Ce, Pr, Nd, Sm, Eu, Gd, Tb, Dy, Ho, Er, Tm, Yb, Lu, Th and U is loaded in the pores of the crystal structure of an ASb$_3$-based compound, where "A" represents at least one element selected from the group consisting of Co, Rh and Ir.

8. A thermoelectric module according to claim 1, wherein said at least one first alloy layer and said at least one second alloy layer further contain at least one element selected from the group consisting of La, Ce, Pr, Nd, Sm, Eu, Gd, Tb, Dy, Ho, Er, Tm, Yb, Lu, Th and U.

9. A thermoelectric module, comprising:

a plurality of p-type thermoelectric elements each comprising a p-type semiconductor having a skutterdite crystal structure, each of said p-type thermoelectric elements having a first surface having a high temperature and a second surface having a temperature lower than that of said first surface;

a plurality of n-type thermoelectric elements each comprising a n-type semiconductor having a skutterdite crystal structure, each of said n-type thermoelectric elements having a first surface having a high temperature and a second surface having a temperature lower than that of said first surface, and said p-type thermoelectric elements and said n-type thermoelectric elements being arranged alternately;

at least one first electrode and at least one second electrode connecting said p-type thermoelectric elements and said n-type thermoelectric elements in series, and said at least one first electrode and said at least one second electrode containing Fe and having a thermal expansion coefficient falling within a range of between $8 \times 10^{-6}/°$ C. and $16 \times 10^{-6}/°$ C.;

at least one first alloy layer for bonding said at least one first electrode to said first surface of said one p-type thermoelectric element and to said first surface of said one n-type thermoelectric element adjacent to said one p-type thermoelectric element; and at least one second alloy layer for bonding said at least one second electrode to said second surface of said one p-type thermoelectric element and to said second surface of said one n-type thermoelectric element adjacent to said one p-type thermoelectric element, wherein said at least one first alloy layer and said at least one second alloy layer contain Sb and at least one transition metal element selected from the group consisting of Ag, Au and Cu.

10. A thermoelectric module according to claim 9, wherein said at least one first electrode and said at least one second electrode are formed of an austenitic stainless steel.

11. A thermoelectric module, comprising:

a plurality of p-type thermoelectric elements each comprising a p-type semiconductor having a skutterdite crystal structure, each of said p-type thermoelectric elements having a first surface having a high temperature and a second surface having a temperature lower than that of said first surface;

a plurality of n-type thermoelectric elements each comprising a n-type semiconductor having a skutterdite crystal structure, each of said n-type thermoelectric elements having a first surface having a high temperature and a second surface having a temperature lower than that of said first surface, and said p-type thermoelectric elements and said n-type thermoelectric elements being arranged alternately;

at least one first electrode and at least one second electrode connecting said p-type thermoelectric elements and said n-type thermoelectric elements in series, and said at least one first electrode and said at least one second electrode containing silver as a main component;

at least one first silver-antimony alloy layer for bonding said at least one first electrode to said first surface of said one p-type thermoelectric element and to said first surface of said one n-type thermoelectric element adjacent to said one p-type thermoelectric element; and at least one second silver-antimony alloy layer for bonding said at least one second electrode to said second surface of said one p-type thermoelectric element and to said second surface of said one n-type thermoelectric element adjacent to said one p-type thermoelectric element.

12. A thermoelectric module according to claim 11, wherein the thickness of said at least one first silver-antimony alloy layer and the thickness of said at least one second silver-antimony alloy layer fall within a range of between 1 µm and 1 mm.

13. A thermoelectric module according to claim 11, wherein at least one of said p-type semiconductor and said n-type semiconductor includes a compound having a filled skutterudite structure in which at least one element selected from the group consisting of La, Ce, Pr, Nd, Sm, Eu, Gd, Tb, Dy, Ho, Er, Tm, Yb, Lu, Th and U is loaded in the pores of the crystal structure of an $ASb_3$-based compound, where "A" represents at least one element selected from the group consisting of Co, Rh and Ir.

14. A thermoelectric module according to claim 11, wherein said at least one first electrode and said at least one second electrode consist essentially of a sintered body of silver, a sintered body of a silver-based material, a metal plate formed of silver or a metal plate formed of a silver-based material.

15. A heat exchanger, comprising the thermoelectric module defined in claim 1.

16. A heat exchanger for performing a heat exchange between a high temperature fluid and a low temperature fluid, said heat exchanger comprising a thermoelectric module arranged between the fluid passageway of said high temperature fluid and the fluid passageway of said low temperature fluid, said thermoelectric module comprising:

a plurality of p-type thermoelectric elements each comprising a p-type semiconductor having a skutterdite crystal structure, each of said p-type thermoelectric elements having a first surface and a second surface;

a plurality of n-type thermoelectric elements each comprising a n-type semiconductor having a skutterdite crystal structure, each of said n-type thermoelectric elements having a first surface and a second surface, and said p-type thermoelectric elements and said n-type thermoelectric elements being arranged alternately;

at least one first electrode and at least one second electrode connecting said p-type thermoelectric elements and said n-type thermoelectric elements in series, said at least one first electrode heated by the fluid passageway of said high temperature fluid, and said at least one second electrode cooled by the fluid passageway of said low temperature fluid;

at least one first alloy layer for bonding said at least one first electrode to said first surface of said one p-type thermoelectric element and to said first surface of said one n-type thermoelectric element adjacent to said one p-type thermoelectric element; and at least one second alloy layer for bonding said at least one second electrode to said second surface of said one p-type thermoelectric element and to said second surface of said one n-type thermoelectric element adjacent to said one p-type thermoelectric element, wherein said at least one first alloy layer and said at least one second alloy layer contain Sb and at least one transition metal element selected from the group consisting of Ag, Au and Cu.

* * * * *